(12) United States Patent
Dean et al.

(10) Patent No.: US 9,229,497 B2
(45) Date of Patent: Jan. 5, 2016

(54) ON-BLADE COLD SINK FOR HIGH-DENSITY CLUSTERED COMPUTER SYSTEM

(71) Applicant: Silicon Graphics International Corp., Fremont, CA (US)

(72) Inventors: Steven J. Dean, Chippewa Falls, WI (US); Richard B. Salmonson, Chippewa Falls, WI (US); Russell E. Stacy, Chippewa Fall, WI (US); Roger Ramseier, Chippewa Falls, WI (US); Mark Maloney, Chippewa Falls, WI (US)

(73) Assignee: Silicon Graphics International Corp., Milpitas, CA (US)

( * ) Notice: Subject to any disclaimer, the term of this patent is extended or adjusted under 35 U.S.C. 154(b) by 192 days.

(21) Appl. No.: 13/931,730

(22) Filed: Jun. 28, 2013

(65) Prior Publication Data

US 2014/0126141 A1 May 8, 2014

Related U.S. Application Data

(60) Provisional application No. 61/724,274, filed on Nov. 8, 2012.

(51) Int. Cl.
*H05K 5/00* (2006.01)
*H05K 7/00* (2006.01)
*G06F 1/20* (2006.01)
(Continued)

(52) U.S. Cl.
CPC ... *G06F 1/20* (2013.01); *G06F 1/181* (2013.01); *H05K 7/20754* (2013.01); *G06F 2200/201* (2013.01)

(58) Field of Classification Search
CPC .................. H05K 7/20745; G06F 1/206

USPC .............. 361/679.46–679.54, 688–747
See application file for complete search history.

(56) References Cited

U.S. PATENT DOCUMENTS

| 4,884,167 | A | 11/1989 | Mine |
| 4,884,168 | A | 11/1989 | August et al. |

(Continued)

FOREIGN PATENT DOCUMENTS

| TW | M413895 | 10/2011 |
| WO | 2012118554 A1 | 9/2012 |

OTHER PUBLICATIONS

Woodacre, M. "Capability system with interconnect for global addressability and hardware collectives," 15th Workshop on High Performance Computing in Meterology, Session 10, Oct. 3, 2012, pp. 5-7 (online), retrieved on Feb. 17, 2014), http://www.ecmwf.int/newsevents/meetings/workshops/2012/high_performance_computing_15th/Presentations/.

(Continued)

*Primary Examiner* — Jerry Wu
(74) *Attorney, Agent, or Firm* — Sunstein Kann Murphy & Timbers LLP

(57) ABSTRACT

A high performance computing system includes one or more blade enclosures having a cooling manifold and configured to hold a plurality of computing blades, and a plurality of computing blades in each blade enclosure with at least one computing blade including two computing boards. The system further includes two or more cooling plates with each cooling plate between two corresponding computing boards within the computing blade, and a fluid connection coupled to the cooling plate(s) and in fluid communication with the fluid cooling manifold.

6 Claims, 23 Drawing Sheets

(51) Int. Cl.
*H05K 7/20* (2006.01)
*G06F 1/18* (2006.01)

(56) References Cited

U.S. PATENT DOCUMENTS

| | | |
|---|---|---|
| 5,810,501 A | 9/1998 | Ross |
| 6,064,575 A | 5/2000 | Urda et al. |
| 7,318,322 B2 | 1/2008 | Ota et al. |
| 7,564,685 B2 | 7/2009 | Clidaras et al. |
| 7,589,974 B2 | 9/2009 | Grady et al. |
| 7,907,406 B1 * | 3/2011 | Campbell et al. ............. 361/699 |
| 8,027,162 B2 | 9/2011 | Campbell et al. |
| 2002/0124114 A1 | 9/2002 | Bottom et al. |
| 2008/0094797 A1 * | 4/2008 | Coglitore et al. ............. 361/687 |
| 2008/0158818 A1 * | 7/2008 | Clidaras et al. ............... 361/699 |
| 2010/0254089 A1 | 10/2010 | Anderl et al. |
| 2011/0013348 A1 | 1/2011 | Seibold et al. |
| 2011/0255230 A1 | 10/2011 | Mori |
| 2012/0147553 A1 | 6/2012 | Eriksen |
| 2012/0293947 A1 | 11/2012 | Chen et al. |

OTHER PUBLICATIONS

International Searching Authority—International Search Report—International Application No. PCT/US2013/061374 dated Feb. 18, 2014, together with the Written Opinion of the International Searching Authority, 11 pages.

\* cited by examiner

ON-BLADE COLD SINK FOR HIGH-DENSITY CLUSTERED COMPUTER SYSTEM

CROSS REFERENCE TO RELATED APPLICATIONS

The present application claims priority to U.S. Provisional Patent Application No. 61/724,274 filed Nov. 8, 2012, the disclosure of which is incorporated by reference herein in its entirety.

The present application is related to U.S. patent application Ser. No. 13/931,748 entitled TWIN SERVER BLADES FOR HIGH-DENSITY CLUSTERED COMPUTER SYSTEM, filed on Jun. 28, 2013, and U.S. patent application Ser. No. 13/931,754 entitled CLOSED-LOOP COOLING SYSTEM FOR HIGH-DENSITY CLUSTERED, filed on Jun. 28, 2013, the disclosures of which are incorporated by reference herein in their entirety.

TECHNICAL FIELD

The invention generally relates to a cooling configuration used with a compute blade in a multi-node computer system and, more particularly, the invention relates to providing an on-blade cold sink for a high-density clustered computer system.

BACKGROUND ART

As high performance computing ("HPC") systems have gotten more powerful, the challenges associated with keeping the components in these more powerful systems cool have become increasingly difficult. In addition, physical constraints are driving many aspects of the high-density clustered computer configuration, which make effective and efficient cooling of the system even more demanding and an essential part of large-scale HPC installations. Standard compute rack and cooling configurations are often unable to adequately provide the cooling requirements needed for high-density clusters. Thus, new cooling designs are needed to accommodate these demanding high-density clustered computer installations.

SUMMARY OF VARIOUS EMBODIMENTS

Various embodiments of the present invention provide a highly-efficient, on-blade cooling system for use with a high performance computing ("HPC") system. In one embodiment of the present invention, the HPC system includes one or more blade enclosures having a cooling manifold and a plurality of computing blades in each blade enclosure with at least one computing blade including two computing boards. The HPC system further includes two or more cooling plates with each cooling plate between two corresponding computing boards within the computing blade, and a fluid connection coupled to the cooling plate(s) and in fluid communication with the fluid cooling manifold.

In one embodiment of the present invention, an on-blade cooling system includes one or more blade enclosures having a cooling manifold and configured to hold a plurality of computing blades, two or more cooling plates, each cooling plate configured to be disposed between two computing boards within the computing blade, and a fluid connection coupled to the cooling plate and in fluid communication with the fluid cooling manifold.

In related embodiments, the cooling manifold may include a supply line and a return line. The cooling manifold may be along a back side of the blade enclosure or may be along a side of the blade enclosure and configured to connect to each cooling plate between the two computing boards. The system may further include one or more air-cooled heat sinks with at least one of the two cooling plates adjacent to the air-cooled heat sink. Four cooling plates may be disposed between the two computing boards, two plates between the two computing boards in one region of the computing blade and the other two plates between the two computing boards in another region of the computing blade. The HPC or cooling system may further include an external cooling distribution unit having fluid connections in fluid communication with the cooling manifold. The external cooling distribution unit may further include a liquid-cooled heat exchanger in contact with a portion of the fluid connections, and one or more pumps configured to move liquid within the fluid connections from the cooling manifolds to the liquid-cooled heat exchanger. The blade enclosures may be configured in two compute racks, and the HPC system may further include a cooling tower adjacent to a side of the first compute rack and a side of the second compute rack. The cooling tower may have at least one water-cooled heat exchanger, and one or more blowers configured to draw warm air from the side towards a back of the first and second compute racks across the water-cooled heat exchanger, and to circulate cooled air to the side towards a front of the first and second compute racks. The HPC system may further include a housing enclosing the first compute rack, the second compute rack, and the cooling tower to provide a closed-loop air flow within the housing. The blade enclosures may be configured in an M-rack or a wide-rack configuration.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, a high performance computing ("HPC") system includes an on-blade cooling system for a plurality of computing blades. The on-blade cooling system includes one or more blade enclosures having a cooling manifold, and two or more liquid-cooled heat sinks or cooling plates internal to the computing blade. Each cooling plate is configured to be disposed between two computing boards within the computing blade. The on-blade cooling system also includes a fluid connection coupling the cooling plate(s) to the cooling manifold. This approach provides a greater cooling capacity (e.g., for processors that exceed 600 watts) over rack-level cooling that utilizes fans and air-cooled heat sinks. Additional cooling may be provided to the blades with a cooling distribution unit that is external to the blade enclosure. In addition, the blades may be further air cooled using a closed-loop air flow arrangement with a cooling tower. Details of illustrative embodiments are discussed below.

System Architecture

Figure 1:
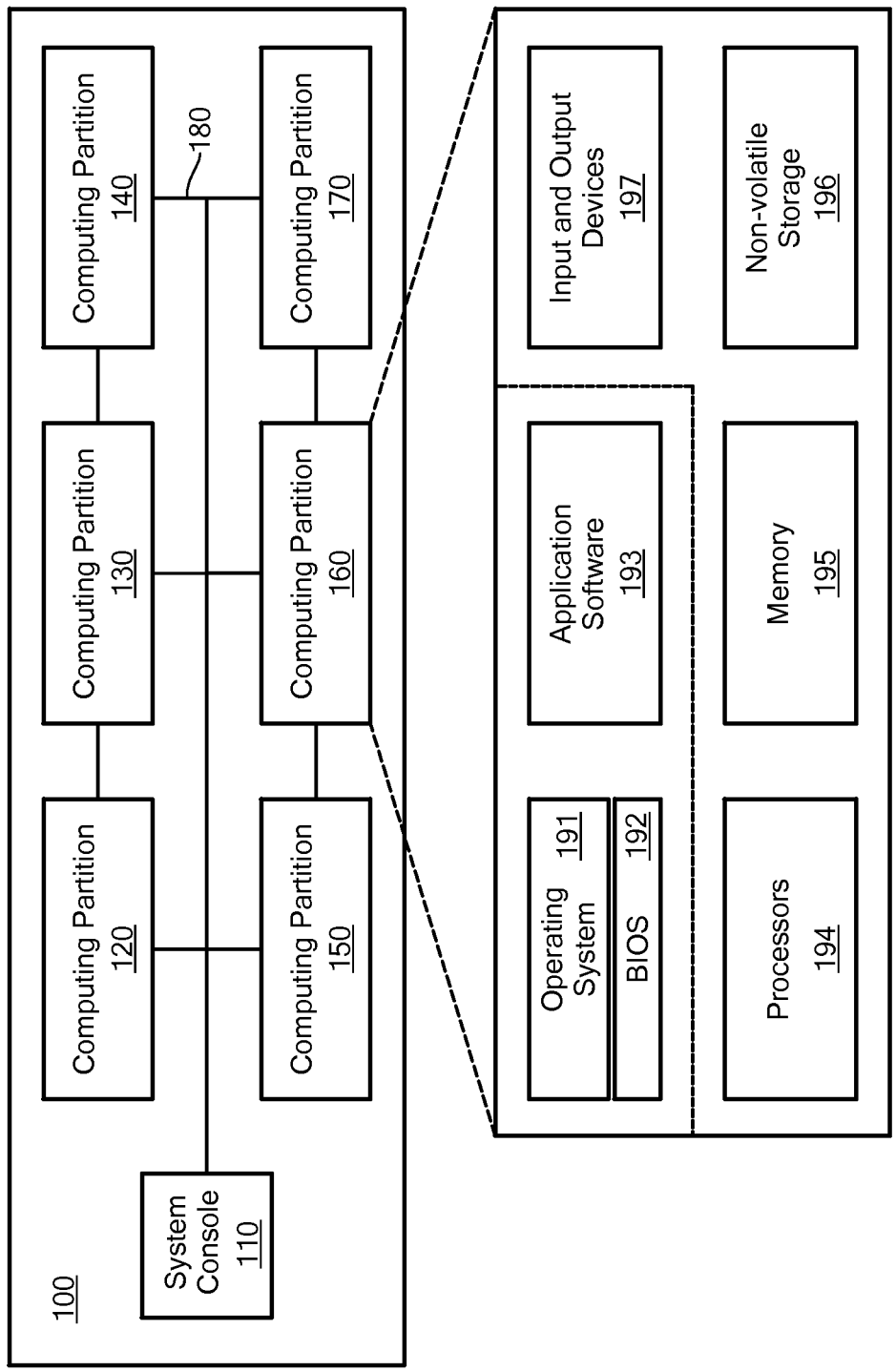
FIG. 1 schematically shows a logical view of an exemplary HPC system used with embodiments of the present invention.

FIG. 1 schematically shows a logical view of an exemplary high-performance computing system 100 that may be used with illustrative embodiments of the present invention. Specifically, as known by those in the art, a "high-performance computing system," or "HPC system," is a computing system having a plurality of modular computing resources that are tightly coupled using hardware interconnects, so that processors may access remote data directly using a common memory address space.

The HPC system 100 includes a number of logical computing partitions 120, 130, 140, 150, 160, 170 for providing computational resources, and a system console 110 for managing the plurality of partitions 120-170. A "computing partition" (or "partition") in an HPC system is an administrative allocation of computational resources that runs a single operating system instance and has a common memory address space. Partitions 120-170 may communicate with the system console 110 using a logical communication network 180. A system user, such as a scientist, engineer, or technician, who desires to perform a calculation, may request computational resources from a system operator, who uses the system console 110 to allocate and manage those resources. Allocation of computational resources to partitions is described below. The HPC system 100 may have any number of computing partitions that are administratively assigned as described in more detail below, and often has only one partition that encompasses all of the available computing resources. Accordingly, this figure should not be seen as limiting the scope of embodiments of the present invention.

Each computing partition, such as partition 160, may be viewed logically as if it were a single computing device, akin to a desktop computer. Thus, the partition 160 may execute software, including a single operating system ("OS") instance 191 that uses a basic input/output system ("BIOS") 192 as these are used together in the art, and application software 193 for one or more system users.

Accordingly, as also shown in FIG. 1, a computing partition may have various hardware allocated to it by a system operator, including one or more processors 194, volatile memory 195, non-volatile storage 196, and input and output ("I/O") devices 197 (e.g., network cards, video display devices, keyboards, and the like). However, in HPC systems like the embodiment in FIG. 1, each computing partition has a great deal more processing power and memory than a typical desktop computer. The OS software may include, for example, a Windows® operating system by Microsoft Corporation of Redmond, Wash., or a Linux operating system. Moreover, although the BIOS may be provided as firmware by a hardware manufacturer, such as Intel Corporation of Santa Clara, Calif., it is typically customized according to the needs of the HPC system designer to support high-performance computing, as described below in more detail.

As part of its system management role, the system console 110 acts as an interface between the computing capabilities of the computing partitions 120-170 and the system operator or other computing systems. To that end, the system console 110 issues commands to the HPC system hardware and software on behalf of the system operator that permit, among other things: 1) booting the hardware, 2) dividing the system computing resources into computing partitions, 3) initializing the partitions, 4) monitoring the health of each partition and any hardware or software errors generated therein, 5) distributing operating systems and application software to the various partitions, 6) causing the operating systems and software to execute, 7) backing up the state of the partition or software therein, 8) shutting down application software, and 9) shutting down a computing partition or the entire HPC system 100. These particular functions are described in more detail in the section below entitled "System Operation."

Figure 2:
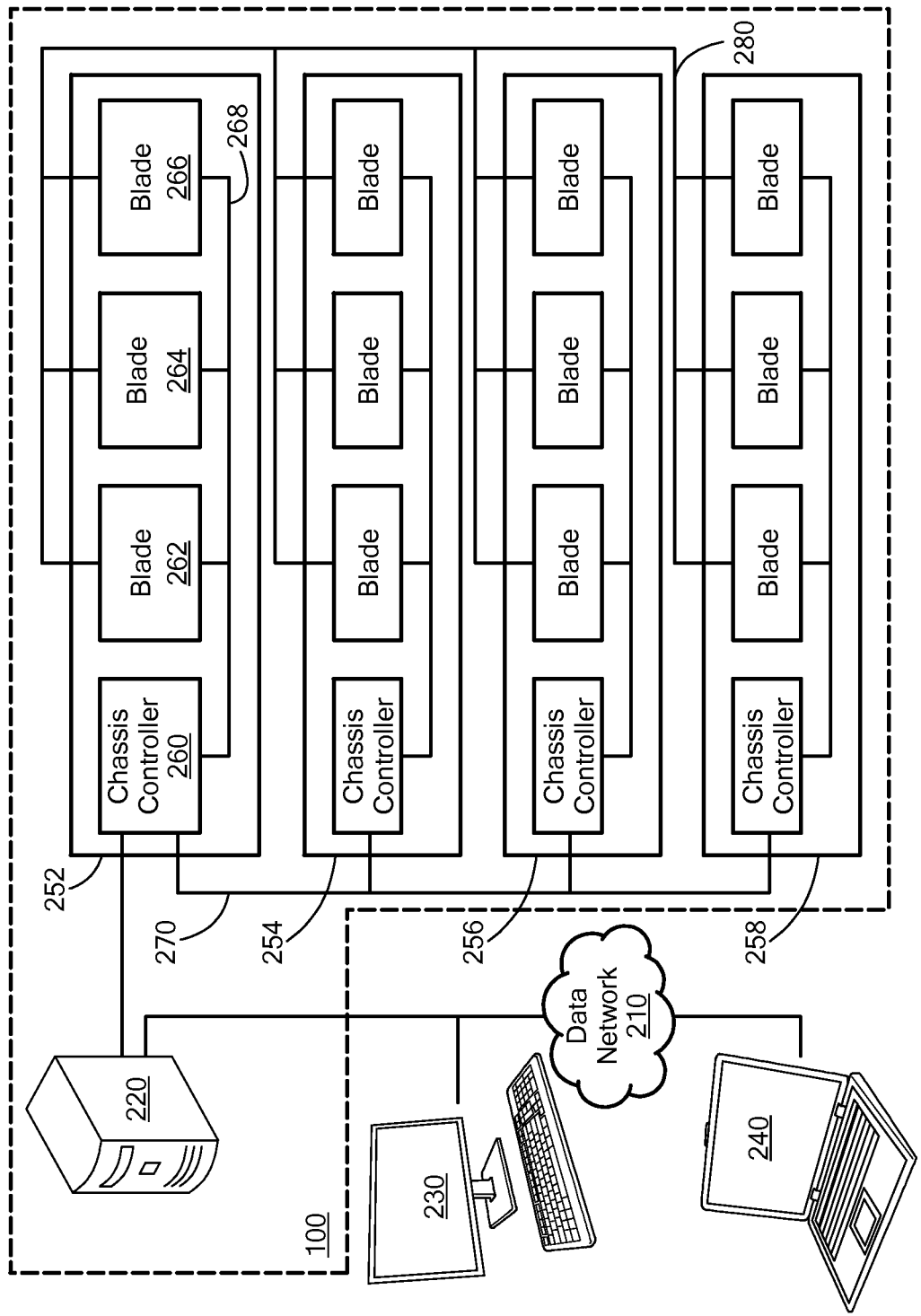
FIG. 2 schematically shows a physical view of the HPC system of FIG. 1.

FIG. 2 schematically shows a physical view of a high performance computing system 100 in accordance with the embodiment of FIG. 1. The hardware that comprises the HPC system 100 of FIG. 1 is surrounded by the dashed line. The HPC system 100 is connected to an enterprise data network 210 to facilitate user access.

The HPC system 100 includes a system management node ("SMN") 220 that performs the functions of the system console 110. The management node 220 may be implemented as a desktop computer, a server computer, or other similar computing device, provided either by the enterprise or the HPC system designer, and includes software necessary to control the HPC system 100 (i.e., the system console software).

The HPC system 100 is accessible using the data network 210, which may include any data network known in the art, such as an enterprise local area network ("LAN"), a virtual private network ("VPN"), the Internet, or the like, or a combination of these networks. Any of these networks may permit a number of users to access the HPC system resources remotely and/or simultaneously. For example, the management node 220 may be accessed by an enterprise computer 230 by way of remote login using tools known in the art such as Windows® Remote Desktop Services or the Unix secure shell. If the enterprise is so inclined, access to the HPC system 100 may be provided to a remote computer 240. The remote computer 240 may access the HPC system by way of a login to the management node 220 as just described, or using a gateway or proxy system as is known to persons in the art.

The hardware computing resources of the HPC system 100 (e.g., the processors, memory, non-volatile storage, and I/O devices shown in FIG. 1) are provided collectively by one or more "blade chassis," such as blade chassis 252, 254, 256, 258 shown in FIG. 2, that are managed and allocated into computing partitions. A blade chassis is an electronic chassis that is configured to house, power, and provide high-speed data communications between a plurality of stackable, modular electronic circuit boards called "blades." Each blade includes enough computing hardware to act as a standalone computing server. The modular design of a blade chassis permits the blades to be connected to power and data lines with a minimum of cabling and vertical space.

Accordingly, each blade chassis, for example blade chassis 252, has a chassis management controller 260 (also referred to as a "chassis controller" or "CMC") for managing system functions in the blade chassis 252, and a number of blades 262, 264, 266 for providing computing resources. Each blade, for example blade 262, contributes its hardware computing resources to the collective total resources of the HPC system 100. The system management node 220 manages the hardware computing resources of the entire HPC system 100 using the chassis controllers, such as chassis controller 260, while each chassis controller in turn manages the resources for just the blades in its blade chassis. The chassis controller 260 is physically and electrically coupled to the blades 262-266 inside the blade chassis 252 by means of a local management bus 268, described below in more detail. The hardware in the other blade chassis 254-258 is similarly configured.

The chassis controllers communicate with each other using a management connection 270. The management connection 270 may be a high-speed LAN, for example, running an Ethernet communication protocol, or other data bus. By contrast, the blades communicate with each other using a computing connection 280. To that end, the computing connection 280 illustratively has a high-bandwidth, low-latency system interconnect, such as NumaLink, developed by Silicon Graphics International Corp. of Fremont, Calif.

The chassis controller 260 provides system hardware management functions to the rest of the HPC system. For example, the chassis controller 260 may receive a system boot command from the SMN 220, and respond by issuing boot commands to each of the blades 262-266 using the local management bus 268. Similarly, the chassis controller 260 may receive hardware error data from one or more of the blades 262-266 and store this information for later analysis in combination with error data stored by the other chassis controllers. In some embodiments, such as that shown in FIG. 2, the SMN 220 or an enterprise computer 230 are provided access to a single, master chassis controller 260 that processes system management commands to control the HPC system 100 and forwards these commands to the other chassis controllers. In other embodiments, however, an SMN 220 is coupled directly to the management connection 270 and issues commands to each chassis controller individually. Persons having ordinary skill in the art may contemplate variations of these designs that permit the same type of functionality, but for clarity only these designs are presented herein.

The blade chassis 252, its blades 262-266, and the local management bus 268 may be provided as known in the art. However, the chassis controller 260 may be implemented using hardware, firmware, or software provided by the HPC system designer. Each blade provides the HPC system 100 with some quantity of processors, volatile memory, non-volatile storage, and I/O devices that are known in the art of standalone computer servers. However, each blade also has hardware, firmware, and/or software to allow these computing resources to be grouped together and treated collectively as computing partitions, as described below in more detail in the section entitled "System Operation."

While FIG. 2 shows an HPC system 100 having four chassis and three blades in each chassis, it should be appreciated that any combination of chassis and blades may be used and these figures do not limit the scope of embodiments of the present invention. For example, an HPC system may have dozens of chassis and hundreds of blades; indeed, HPC systems often are desired because they provide very large quantities of tightly-coupled computing resources.

Figure 3:
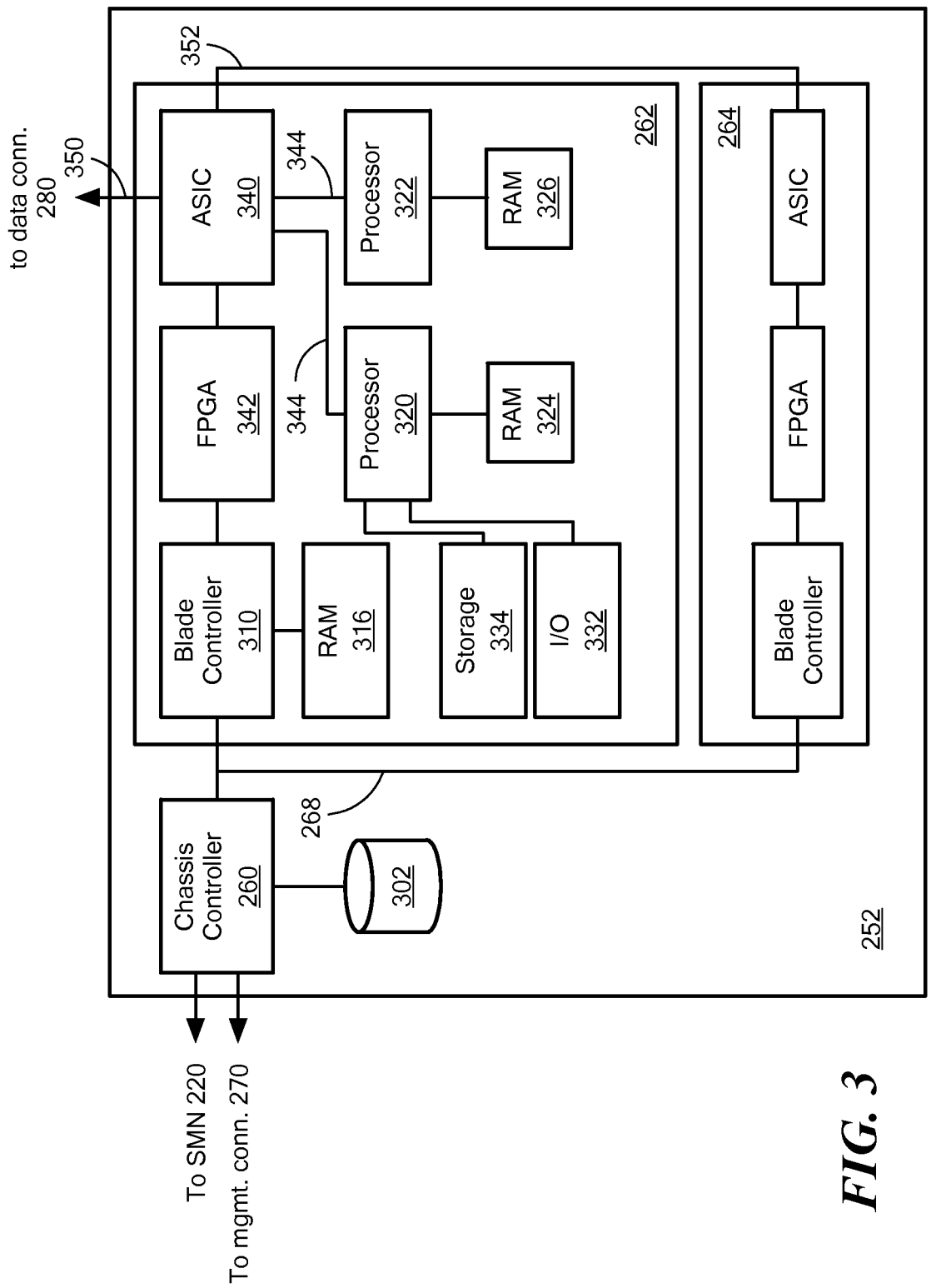
FIG. 3 schematically shows details of an exemplary blade chassis of the HPC system of FIG. 1.

FIG. 3 schematically shows a single blade chassis 252 in more detail. In this figure, parts not relevant to the immediate description have been omitted. The chassis controller 260 is shown with its connections to the system management node 220 and to the management connection 270. The chassis controller 260 may be provided with a chassis data store 302 for storing chassis management data. The chassis data store 302 may be volatile random access memory ("RAM"), in which case data in the chassis data store 302 are accessible by the SMN 220 so long as power is applied to the blade chassis 252, even if one or more of the computing partitions has failed (e.g., due to an OS crash) or a blade has malfunctioned. The chassis data store 302 may be non-volatile storage such as a hard disk drive ("HDD") or a solid state drive ("SSD"). In this case, data in the chassis data store 302 are accessible after the HPC system has been powered down and rebooted.

FIG. 3 shows relevant portions of specific implementations of the blades 262 and 264 for discussion purposes. The blade 262 includes a blade management controller 310 (also called a "blade controller" or "BMC") that executes system management functions at a blade level, in a manner analogous to the functions performed by the chassis controller at the chassis level. For more detail on the operations of the chassis controller and blade controller, see the section entitled "System Operation" below. The blade controller 310 may be implemented as custom hardware, designed by the HPC system designer to permit communication with the chassis controller 260. In addition, the blade controller 310 may have its own RAM 316 to carry out its management functions. The chassis controller 260 communicates with the blade controller of each blade using the local management bus 268, as shown in FIG. 3 and the previous figures.

The blade 262 also includes one or more processors 320, 322 that are connected to RAM 324, 326. Blade 262 may be alternately configured so that multiple processors may access a common set of RAM on a single bus, as is known in the art. It should also be appreciated that processors 320, 322 may include any number of central processing units ("CPUs") or cores, as is known in the art. The processors 320, 322 in the blade 262 are connected to other items, such as a data bus that communicates with I/O devices 332, a data bus that communicates with non-volatile storage 334, and other buses commonly found in standalone computing systems. (For clarity, FIG. 3 shows only the connections from processor 320 to these other devices.) The processors 320, 322 may be, for example, Intel® Core™ processors manufactured by Intel Corporation. The I/O bus may be, for example, a PCI or PCI Express ("PCIe") bus. The storage bus may be, for example, a SATA, SCSI, or Fibre Channel bus. It will be appreciated that other bus standards, processor types, and processor manufacturers may be used with illustrative embodiments of the present invention.

Each blade (e.g., the blades 262 and 264) includes an application-specific integrated circuit 340 (also referred to as an "ASIC", "hub chip", or "hub ASIC") that controls much of its functionality. More specifically, to logically connect the processors 320, 322, RAM 324, 326, and other devices 332, 334 together to form a managed, multi-processor, coherently-shared distributed-memory HPC system, the processors 320, 322 are electrically connected to the hub ASIC 340. The hub ASIC 340 thus provides an interface between the HPC system management functions generated by the SMN 220, chassis controller 260, and blade controller 310, and the computing resources of the blade 262.

In this connection, the hub ASIC 340 connects with the blade controller 310 by way of a field-programmable gate array ("FPGA") 342 or similar programmable device for passing signals between integrated circuits. In particular, signals are generated on output pins of the blade controller 310, in response to commands issued by the chassis controller 260. These signals are translated by the FPGA 342 into commands for certain input pins of the hub ASIC 340, and vice versa. For example, a "power on" signal received by the blade controller 310 from the chassis controller 260 requires, among other things, providing a "power on" voltage to a certain pin on the hub ASIC 340; the FPGA 342 facilitates this task.

The field-programmable nature of the FPGA 342 permits the interface between the blade controller 310 and ASIC 340 to be reprogrammable after manufacturing. Thus, for example, the blade controller 310 and ASIC 340 may be designed to have certain generic functions, and the FPGA 342 may be used advantageously to program the use of those functions in an application-specific way. The communications interface between the blade controller 310 and ASIC 340 also may be updated if a hardware design error is discovered in either module, permitting a quick system repair without requiring new hardware to be fabricated.

Also in connection with its role as the interface between computing resources and system management, the hub ASIC 340 is connected to the processors 320, 322 by way of a high-speed processor interconnect 344. In one embodiment, the processors 320, 322 are manufactured by Intel Corporation which provides the Intel® QuickPath Interconnect ("QPI") for this purpose, and the hub ASIC 340 includes a module for communicating with the processors 320, 322 using QPI. Other embodiments may use other processor interconnect configurations.

The hub chip 340 in each blade also provides connections to other blades for high-bandwidth, low-latency data communications. Thus, the hub chip 340 includes a link 350 to the computing connection 280 that connects different blade chassis. This link 350 may be implemented using networking cables, for example. The hub ASIC 340 also includes connections to other blades in the same blade chassis 252. The hub ASIC 340 of blade 262 connects to the hub ASIC 340 of blade 264 by way of a chassis computing connection 352. The chassis computing connection 352 may be implemented as a data bus on a backplane of the blade chassis 252 rather than using networking cables, advantageously allowing the very high speed data communication between blades that is required for high-performance computing tasks. Data communication on both the inter-chassis computing connection 280 and the intra-chassis computing connection 352 may be implemented using the NumaLink protocol or a similar protocol.

System Operation

System management commands generally propagate from the SMN 220, through the management connection 270 to the blade chassis (and their chassis controllers), then to the blades (and their blade controllers), and finally to the hub ASICS that implement the commands using the system computing hardware.

For example, consider the process of powering on an HPC system. The HPC system 100 is powered when a system operator issues a "power on" command from the SMN 220. The SMN 220 propagates this command to each of the blade chassis 252-258 by way of their respective chassis controllers, such as chassis controller 260 in blade chassis 252. Each chassis controller, in turn, issues a "power on" command to each of the respective blades in its blade chassis by way of their respective blade controllers, such as blade controller 310 of blade 262. Blade controller 310 issues a "power on" command to its corresponding hub chip 340 using the FPGA 342, which provides a signal on one of the pins of the hub chip 340 that allows it to initialize. Other commands propagate similarly.

Once the HPC system is powered on, its computing resources may be divided into computing partitions. The quantity of computing resources that are allocated to each computing partition is an administrative decision. For example, an enterprise may have a number of projects to complete, and each project is projected to require a certain amount of computing resources. Different projects may require different proportions of processing power, memory, and I/O device usage, and different blades may have different quantities of the resources installed. The HPC system administrator takes these considerations into account when partitioning the computing resources of the HPC system 100. Partitioning the computing resources may be accomplished by programming each blade's RAM 316. For example, the SMN 220 may issue appropriate blade programming commands after reading a system configuration file.

The collective hardware computing resources of the HPC system 100 may be divided into computing partitions according to any administrative need. Thus, for example, a single computing partition may include the computing resources of some or all of the blades of one blade chassis 252, all of the blades of multiple blade chassis 252 and 254, some of the blades of one blade chassis 252 and all of the blades of blade chassis 254, all of the computing resources of the entire HPC system 100, or other similar combinations. Hardware computing resources may be partitioned statically, in which case a reboot of the entire HPC system 100 is required to reallocate hardware. Alternatively and preferably, hardware computing resources are partitioned dynamically while the HPC system 100 is powered on. In this way, unallocated resources may be assigned to a partition without interrupting the operation of other partitions.

It should be noted that once the HPC system 100 has been appropriately partitioned, each partition may be considered to act as a standalone computing system. Thus, two or more partitions may be combined to form a logical computing group inside the HPC system 100. Such grouping may be necessary if, for example, a particular computational task is allocated more processors or memory than a single operating system can control. For example, if a single operating system can control only 64 processors, but a particular computational task requires the combined power of 256 processors, then four partitions may be allocated to the task in such a group. This grouping may be accomplished using techniques known in the art, such as installing the same software on each computing partition and providing the partitions with a VPN.

Once at least one partition has been created, the partition may be booted and its computing resources initialized. Each computing partition, such as partition 160, may be viewed logically as having a single OS 191 and a single BIOS 192. As is known in the art, a BIOS is a collection of instructions that electrically probes and initializes the available hardware to a known state so that the OS can boot, and is typically provided in a firmware chip on each physical server. However, a single logical computing partition 160 may span several blades, or even several blade chassis. A blade may be referred to as a "computing node" or simply a "node" to emphasize its allocation to a particular partition; however, it will be understood that a physical blade may comprise more than one computing node if it has multiple processors 320, 322 and memory 324, 326.

Booting a partition may require a number of modifications to be made to a standard blade chassis. In particular, the BIOS in each blade is modified to determine other hardware resources in the same computing partition, not just those in the same blade or blade chassis. After a boot command has been issued by the SMN 220, the hub ASIC 340 eventually provides an appropriate signal to the processor 320 to begin the boot process using BIOS instructions. The BIOS instructions, in turn, obtain partition information from the hub ASIC 340 such as: an identification (node) number in the partition, a node interconnection topology, a list of devices that are present in other nodes in the partition, a master clock signal used by all nodes in the partition, and so on. Armed with this information, the processor 320 may take whatever steps are required to initialize the blade 262, including 1) non-HPC-specific steps such as initializing I/O devices 332 and non-volatile storage 334, and 2) also HPC-specific steps such as synchronizing a local hardware clock to a master clock signal, initializing HPC-specialized hardware in a given node, managing a memory directory that includes information about which other nodes in the partition have accessed its RAM, and preparing a partition-wide physical memory map.

At this point, each physical BIOS has its own view of the partition, and all of the computing resources in each node are prepared for the OS to load. The BIOS then reads the OS image and executes it, in accordance with techniques known in the art of multiprocessor systems. The BIOS presents to the OS a view of the partition hardware as if it were all present in a single, very large computing device, even if the hardware itself is scattered among multiple blade chassis and blades. In this way, a single OS instance spreads itself across some, or preferably all, of the blade chassis and blades that are assigned to its partition. Different operating systems may be installed on the various partitions. If an OS image is not present, for example immediately after a partition is created, the OS image may be installed using processes known in the art before the partition boots.

Once the OS is safely executing, its partition may be operated as a single logical computing device. Software for carrying out desired computations may be installed to the various partitions by the HPC system operator. Users may then log into the SMN 220. Access to their respective partitions from the SMN 220 may be controlled using volume mounting and directory permissions based on login credentials, for example. The system operator may monitor the health of each partition, and take remedial steps when a hardware or software error is detected. The current state of long-running application programs may be saved to non-volatile storage, either periodically or on the command of the system operator or application user, to guard against losing work in the event of a system or application crash. The system operator or a system user may issue a command to shut down application software. Other operations of an HPC partition may be known to a person having ordinary skill in the art. When administratively required, the system operator may shut down a computing partition entirely, reallocate or deallocate computing resources in a partition, or power down the entire HPC system 100.

On-Blade Cooling System

Figure 4A:
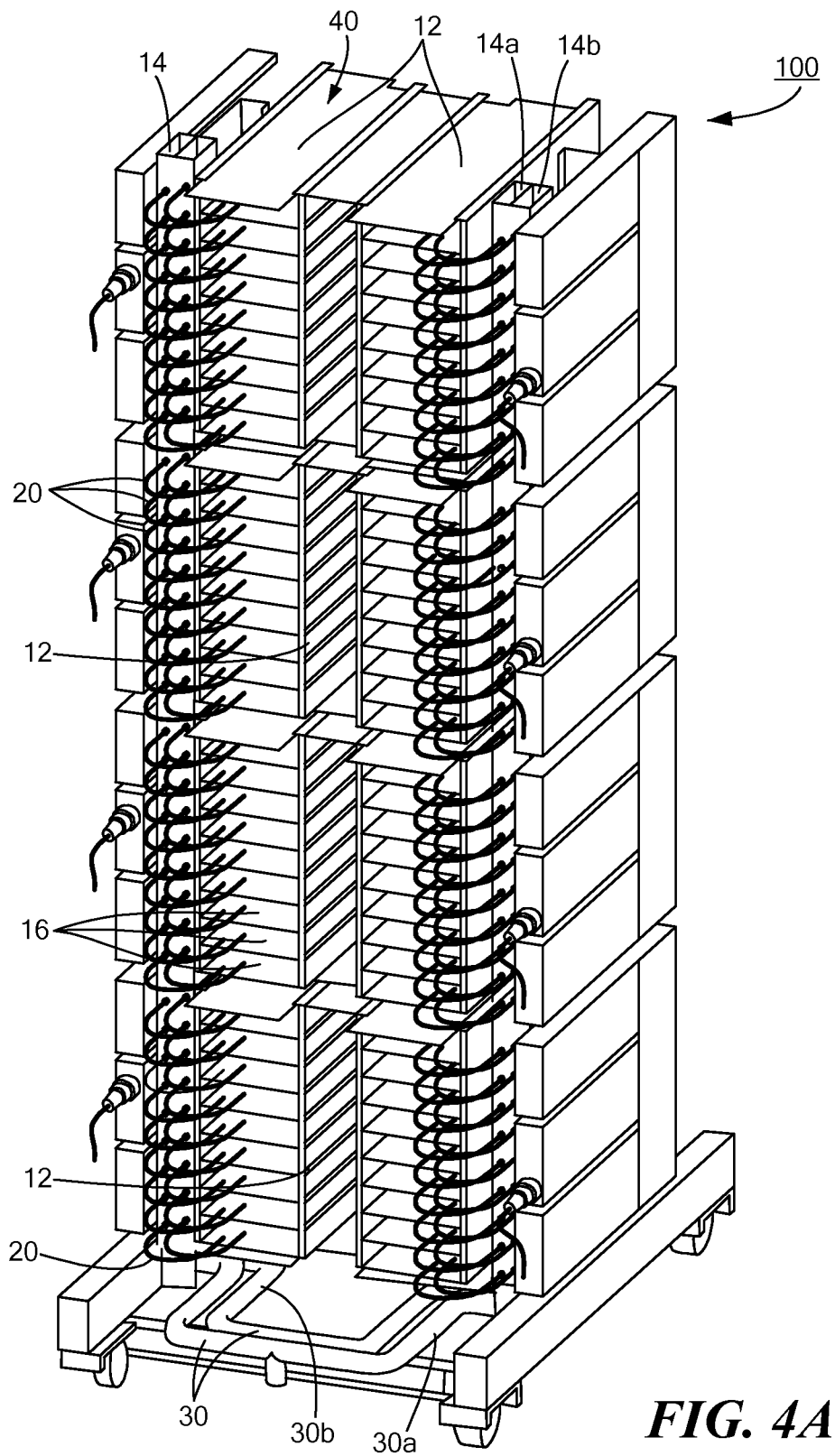
FIGS. 4A and 4B schematically show a front perspective view and front view, respectively, of an M-Rack configuration using an on-blade cooling system in accordance with an embodiment of the present invention.
Figure 4B:
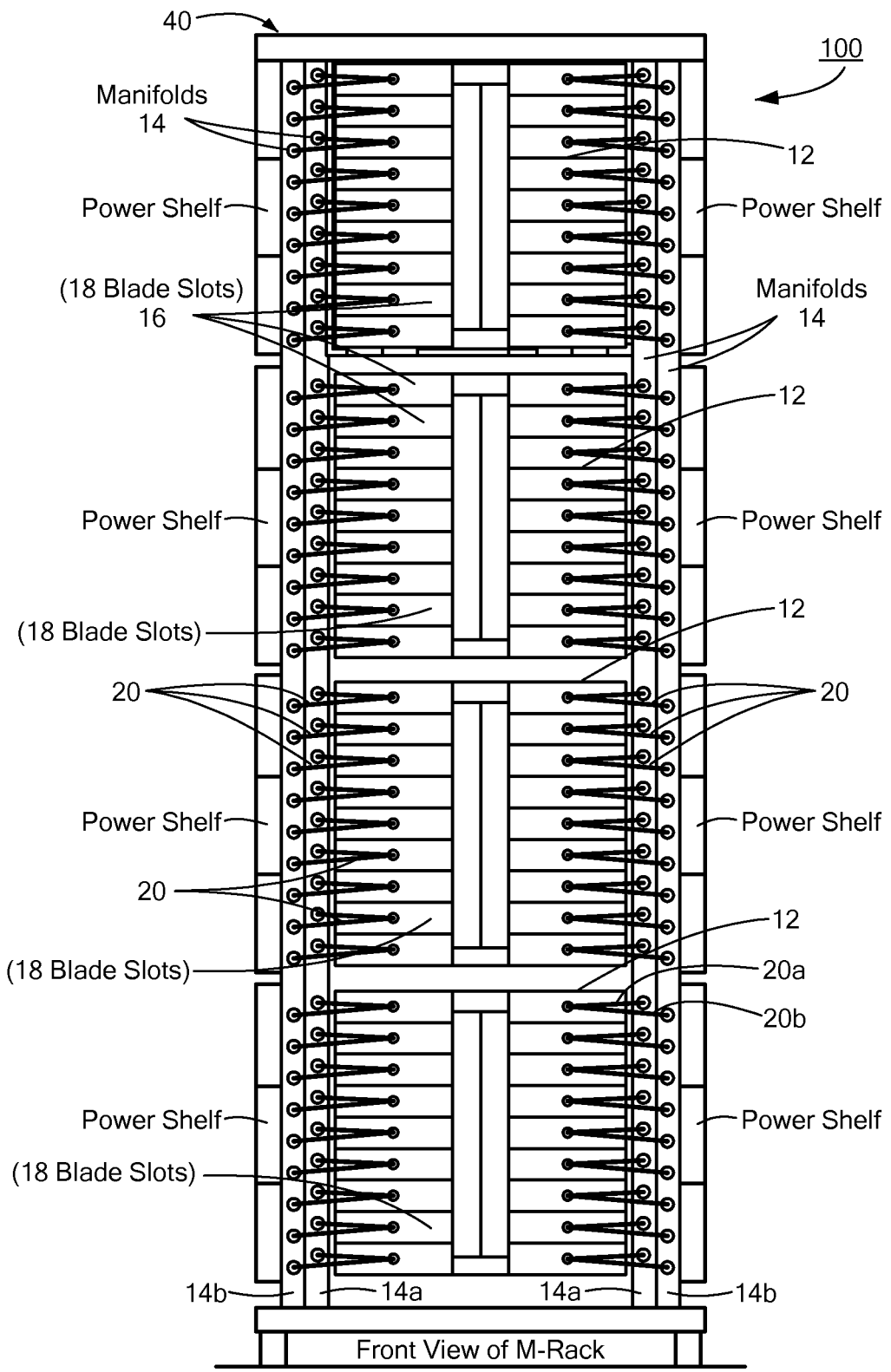
Figure 5A:
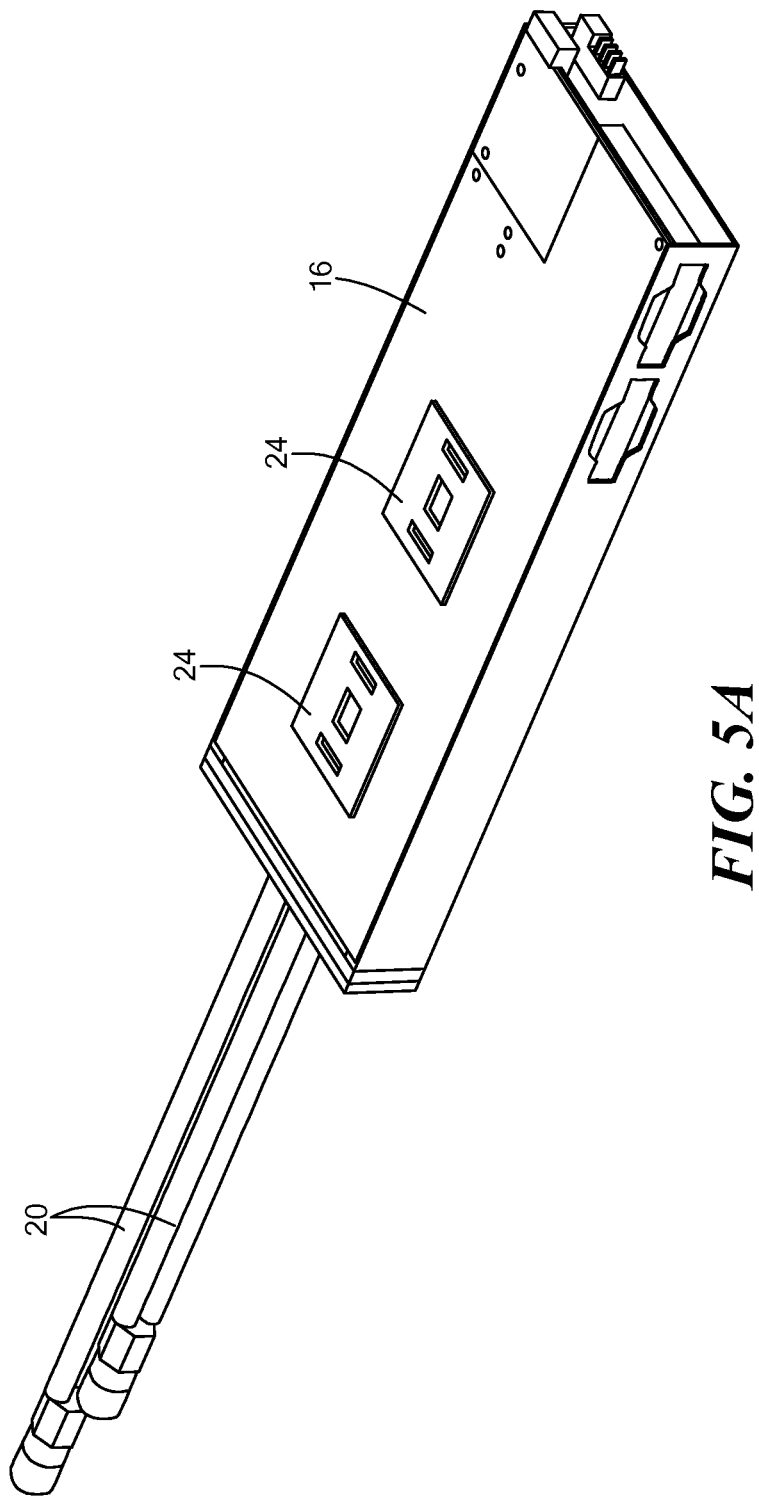
FIGS. 5A and 5B schematically show a perspective view and an exploded view, respectively, of a computing blade with an on-blade cold sink in accordance with an embodiment of the present invention.
Figure 5B:
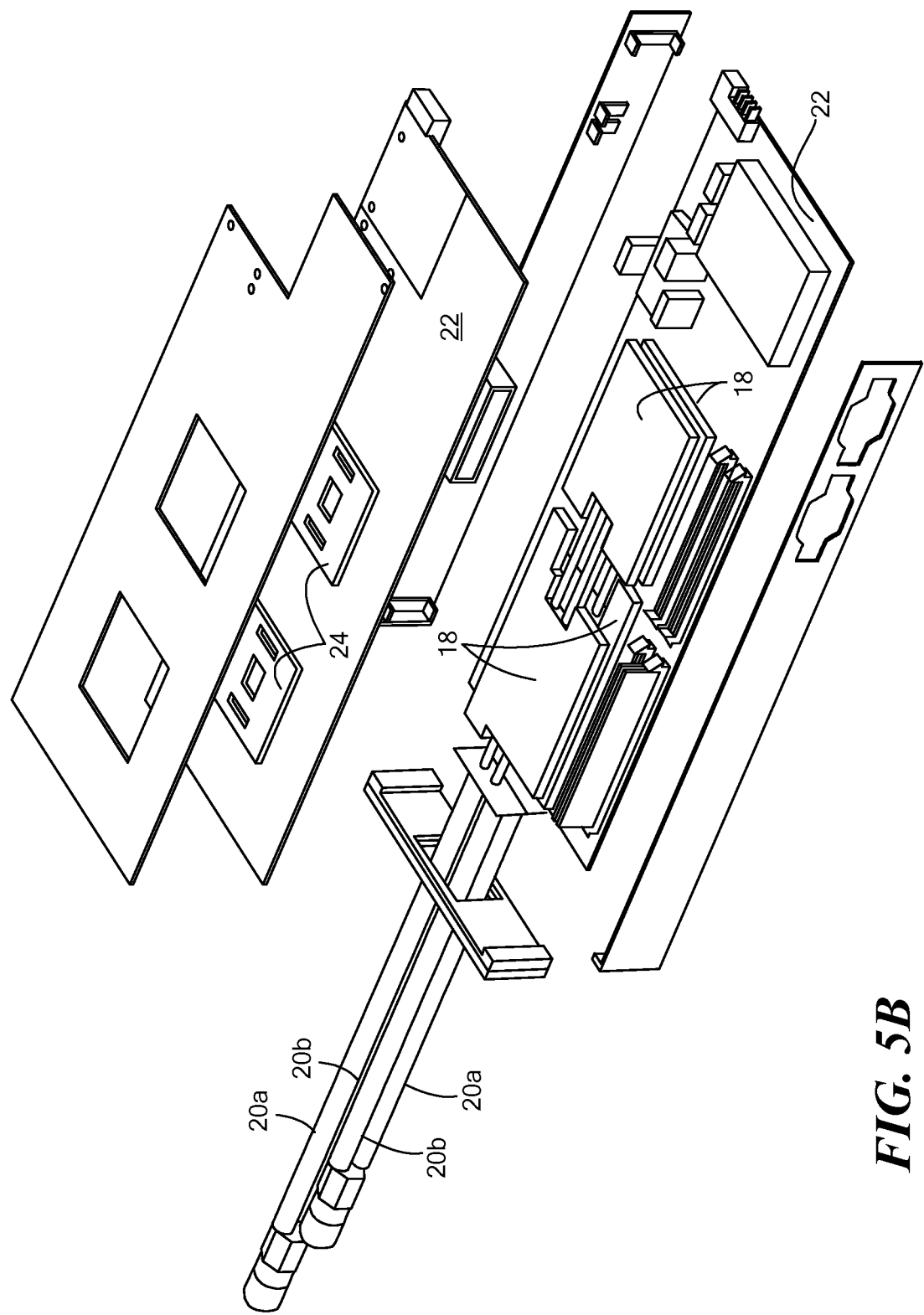
Figure 6A:
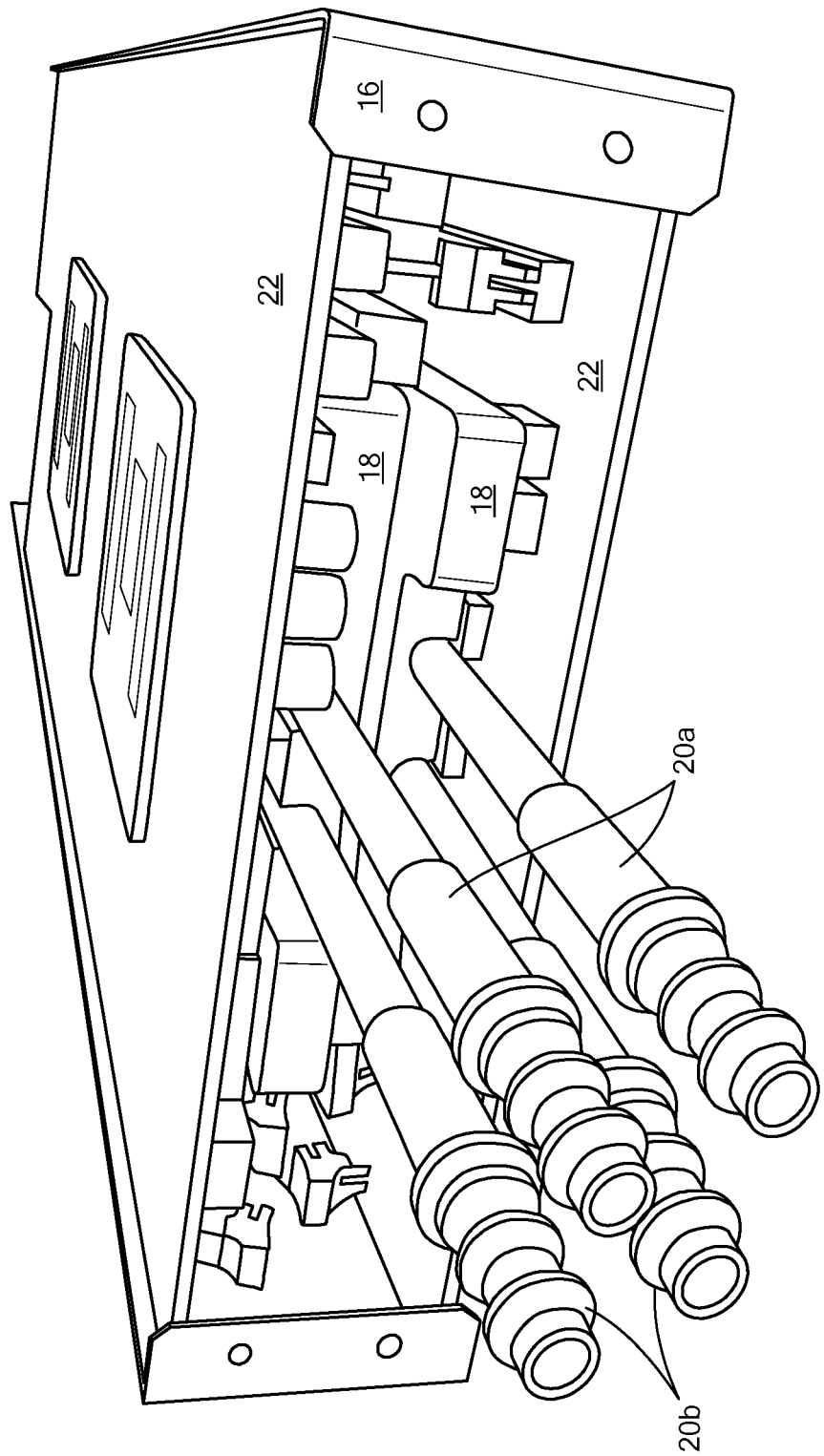
FIGS. 6A and 6B show a side perspective view and top perspective view, respectively, of a blade with an on-blade cold sink in accordance with an embodiment of the present invention.
Figure 6B:
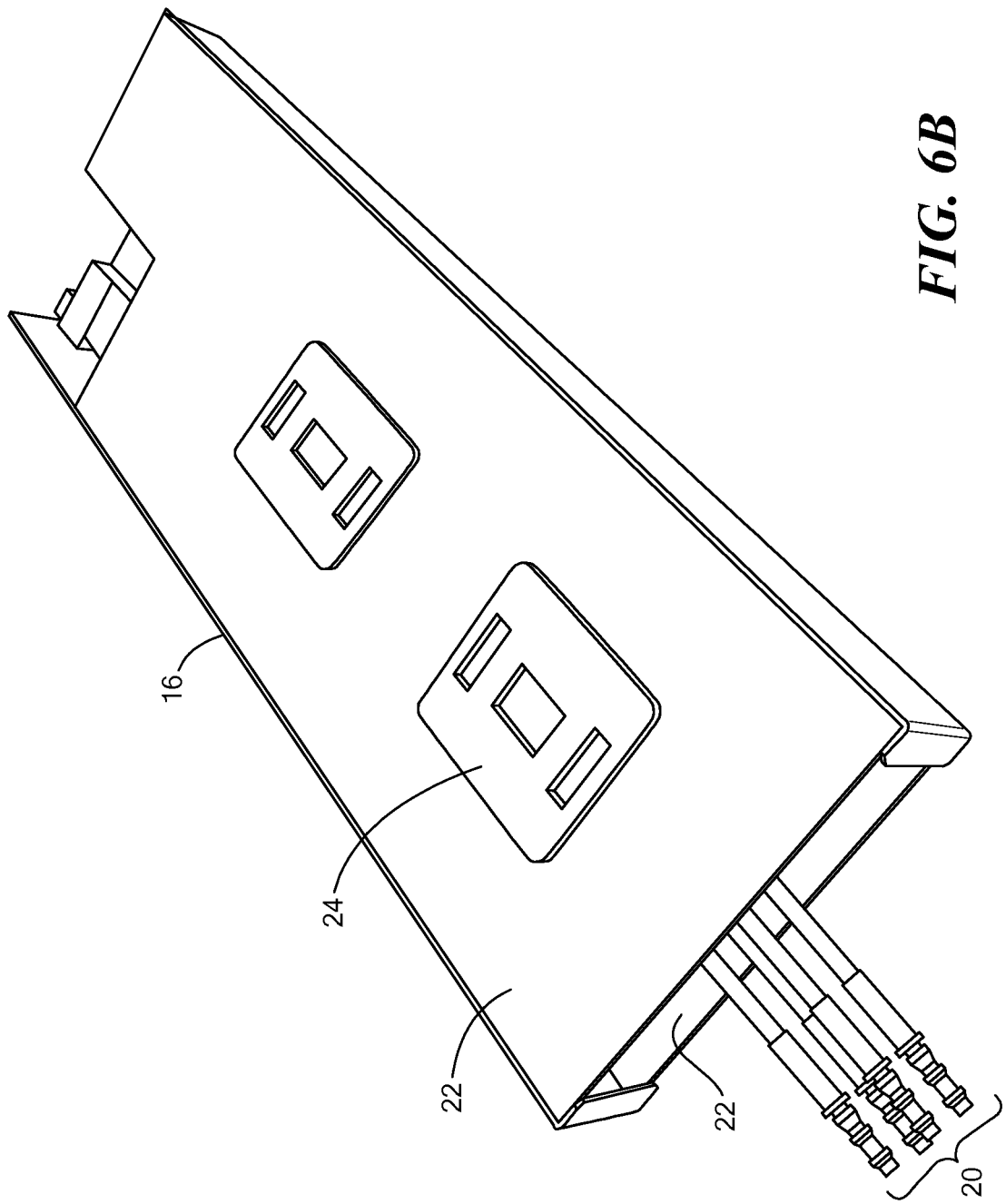
Figure 16:
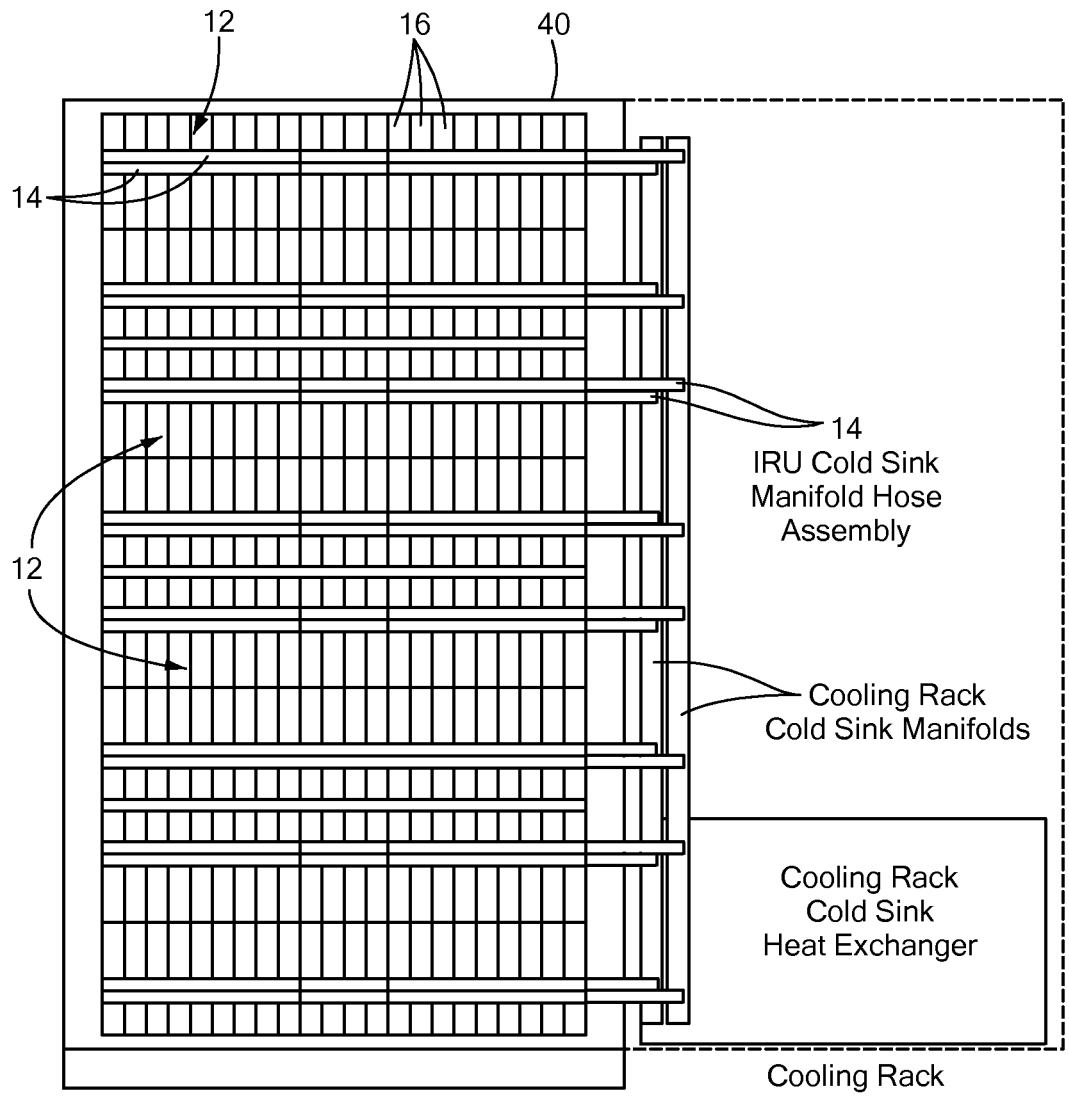
FIG. 16 schematically shows a rear view of a wide rack configuration used with embodiments of the present invention.

FIGS. 4A and 4B schematically show an HPC system 100 that includes an on-blade cooling system for a plurality of computing blades. The on-blade cooling system includes one or more blade enclosures 12 having a cooling manifold 14 and configured to hold a plurality of computing blades 16. The cooling system also includes two or more cooling plates 18 (shown and discussed in more detail in FIGS. 5B and 8 through 11) and a fluid connection 20 coupled to the cooling plate 18 and in fluid communication with the cooling manifold 14. The cooling manifold 14 may include a dedicated supply line 14a and a return line 14b, which may be fluidly coupled to a respective supply line 20a and return line 20b of the fluid connection 20. The cooling manifold 14 may be vertically disposed along a side of the blade enclosure 12, such as shown in FIGS. 4A and 4B, or may be horizontally and vertically disposed, such as shown in FIG. 16.

Referring also to FIGS. 5A, 5B, 6A, and 6B, the two or more cooling plates 18 are configured to be disposed between two computing boards 22 within the computing blade 16. Preferably, each computing board 22 may be configured as a separate computing node, so that the computing blade 16 includes two computing nodes that are logically independent, but that are physically joined together and share various hardware components, in order to share a single slot in the blade enclosure 12. In this way, the loss of one computing board 22 does not render the entire computing blade 16 inoperable. This dual-node configuration effectively doubles the achievable compute density over the existing single node blade configurations. In addition, the compute blade 16 may include two side rails configured to hold the computing board 22 within the blade. Further details of the dual-node configuration can be found in the application entitled TWIN SERVER BLADES FOR HIGH-DENSITY CLUSTERED COMPUTER SYSTEM, which is incorporated by reference herein in its entirety.

Figure 7:
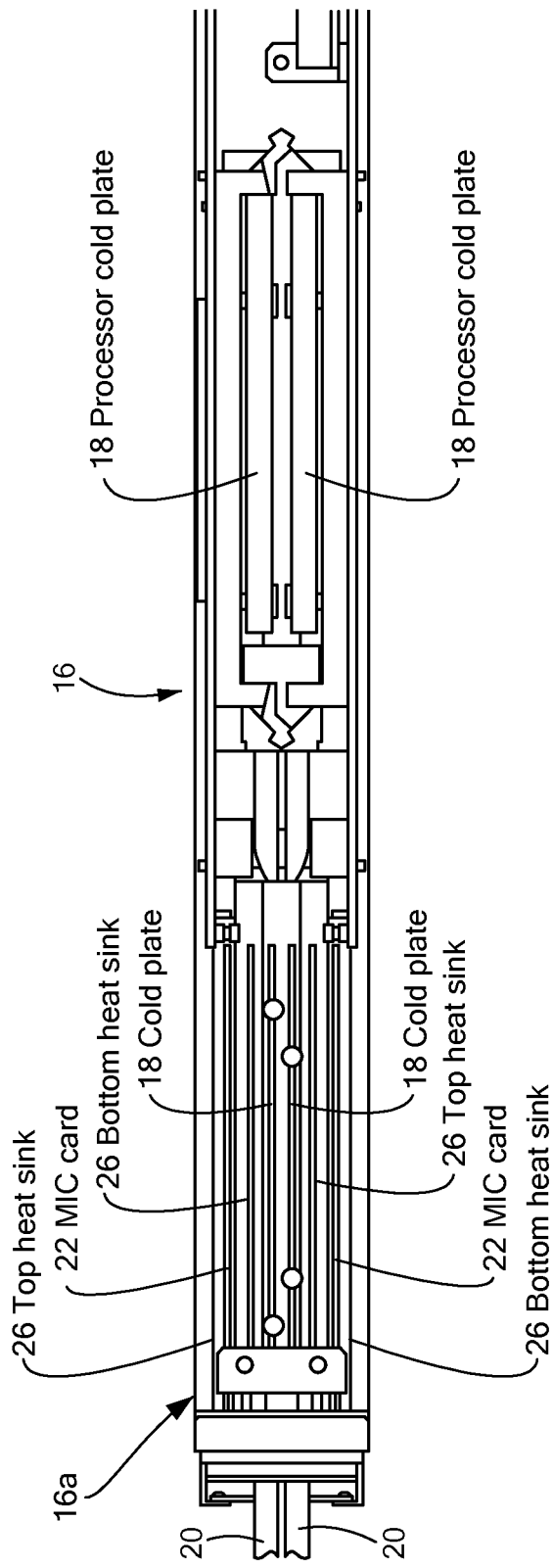
FIG. 7 schematically shows a cross-sectional view of a blade with an on-blade cold sink in accordance with an embodiment of the present invention.

The cooling plates 18 are located between the processor cores 24 on the upper and lower computing boards 22. Depending on the configuration, the on-blade cooling system may absorb approximately 50-60% of the heat dissipated by an individual dual-socket node in a computing blade 16. The cooling plates 18 may replace the heat sinks typically used with processors within computing blades. Alternatively, the cooling plates 18 may be used in conjunction with heat sinks, such as shown in FIG. 7. For example, in one region of the computing blade 16 (e.g., region 16a), heat sinks 26 may be placed on either side of a computing board 22 and then a cooling plate 18 may be placed adjacent to one or more of the heat sinks 26. Any additional heat may be air cooled by fans located at the back of the rack or air-cooled by a closed-loop air flow configuration as discussed in more detail in the section entitled "Closed-loop Cooling Cell Configuration with CDU" below.

Figure 8:
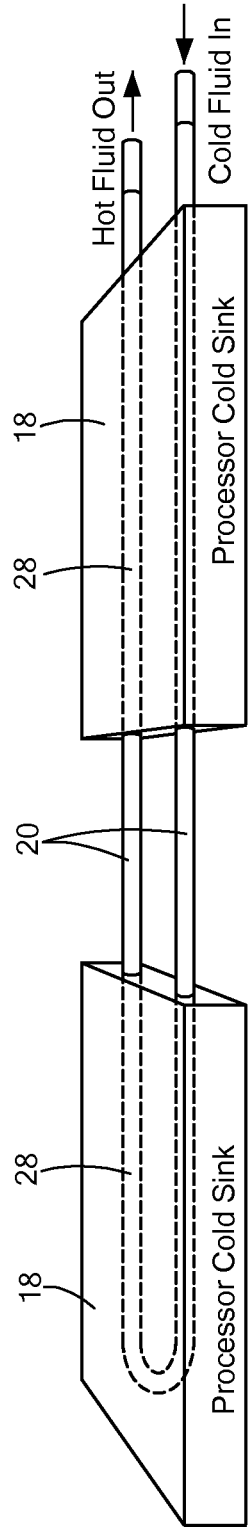
FIG. 8 schematically shows a top perspective view of a single cold sink plate configuration in accordance with an embodiment of the present invention.
Figure 9:
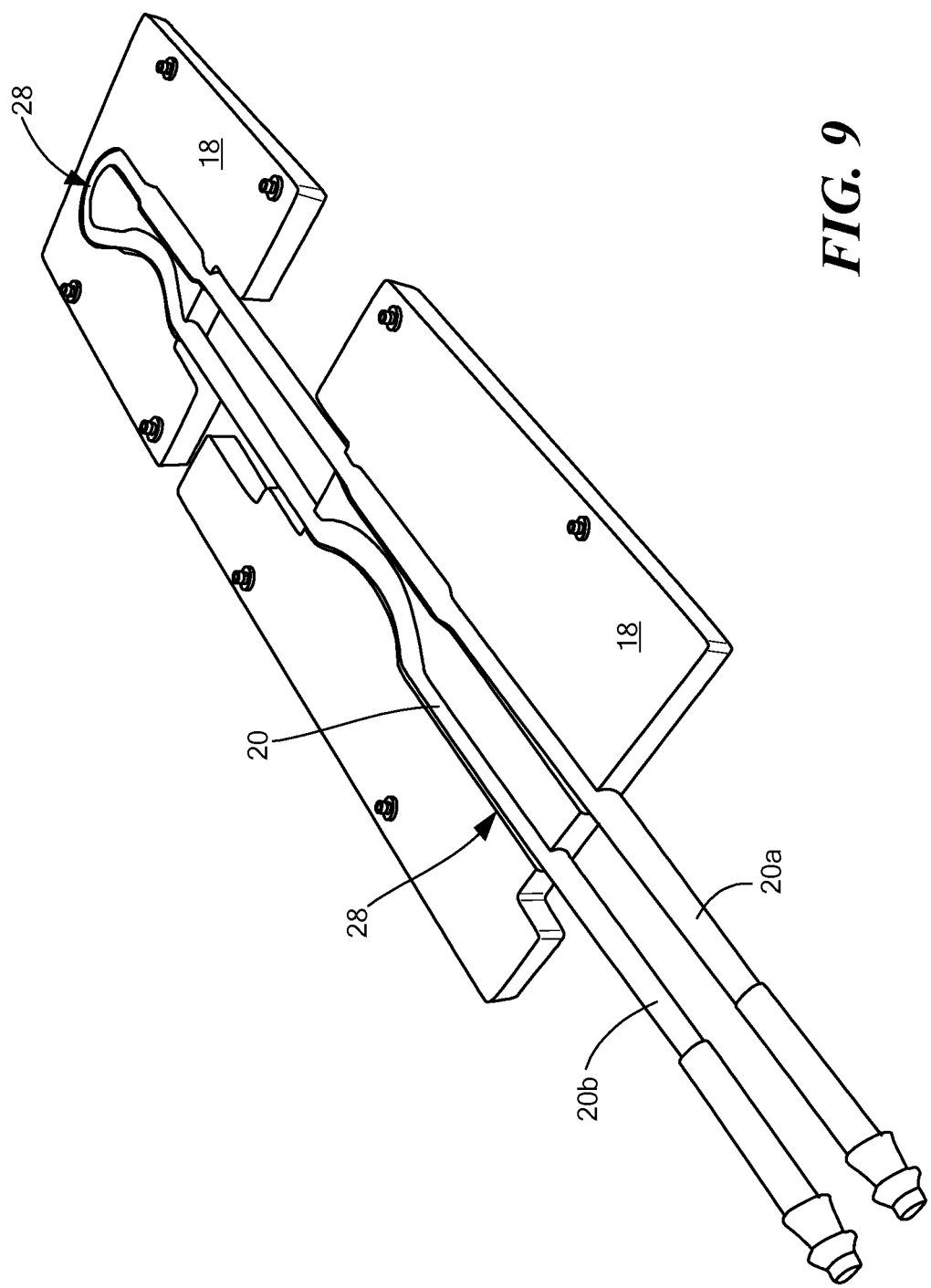
FIG. 9 shows a top perspective view of a single cold sink plate configuration in accordance with an embodiment of the present invention.

As shown in FIGS. 8 and 9, the cooling plates 18 have internal passages 28 that allow a cooling liquid (e.g., water) to flow through the passages in order to remove the heat in the cooling plates 18. The heat is generated by the processors 24 in the computing blade 16 and absorbed by the cooling plates 18. In operation, the cooling liquid flows through fluid connections 30 to a supply line 14a in the cooling manifolds 14 in the blade enclosures 12 and then through the supply line 20a of the fluid connections 20 that connects each individual blade 16 to the cooling manifolds 14. The cooling liquid then flows through the return line 20b to a return line 14b in the cooling manifold 14 and the warmed cooling liquid is returned via the fluid connections 30. The fluid connections 30 may be connected to a broad range of facilities supplied cooling water via supply lines 30a and return lines 30b, with or without an additional external chiller unit connected to the fluid connections 30. In situations where additional cooling is needed, a liquid-to-water heat exchanger may be connected to the fluid connections 30, as discussed further in the section entitled "Cooling Distribution Unit with On-Blade Cooling" below.

The cooling plates 18 may be configured is a variety of ways. For example, one approach may use a spider cold sink that integrates a thermal spreader, formed by a net shape extrusion process, with a spring stamping (e.g., x-shaped) in the areas that are adjacent to the processors. A fluid connection material, e.g., copper tubing, may then be swaged into the recesses or internal passages 28 formed in the extrusion, such as shown in FIG. 9. The portion of the fluid connection 20 or tubing that is in contact with the cooling plate 18 is preferably formed of a heat conducting material, such as copper, so that the heat absorbed in the cooling plates 18 may be readily transferred to the cooling fluid within the fluid connections 20. However, the fluid connection 20 may then be formed of another material, e.g., flexible tubing or hose, in order to more easily connect it to the cooling manifold 14. This configuration simplifies construction and eliminates machining and complexity, although other configurations may also be used.

Figure 10:
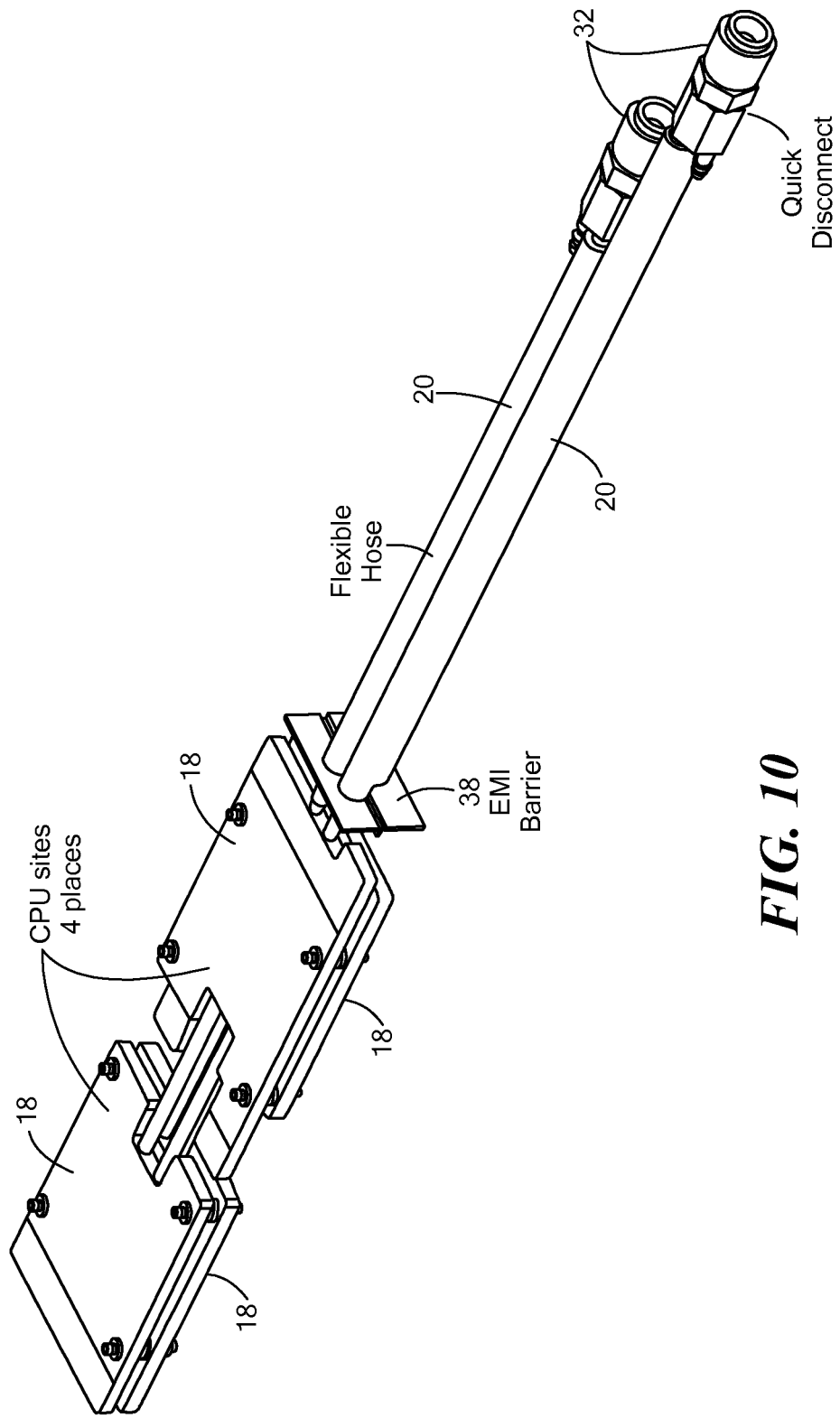
FIG. 10 schematically shows a double cold sink plate configuration in accordance with an embodiment of the present invention.
Figure 11:
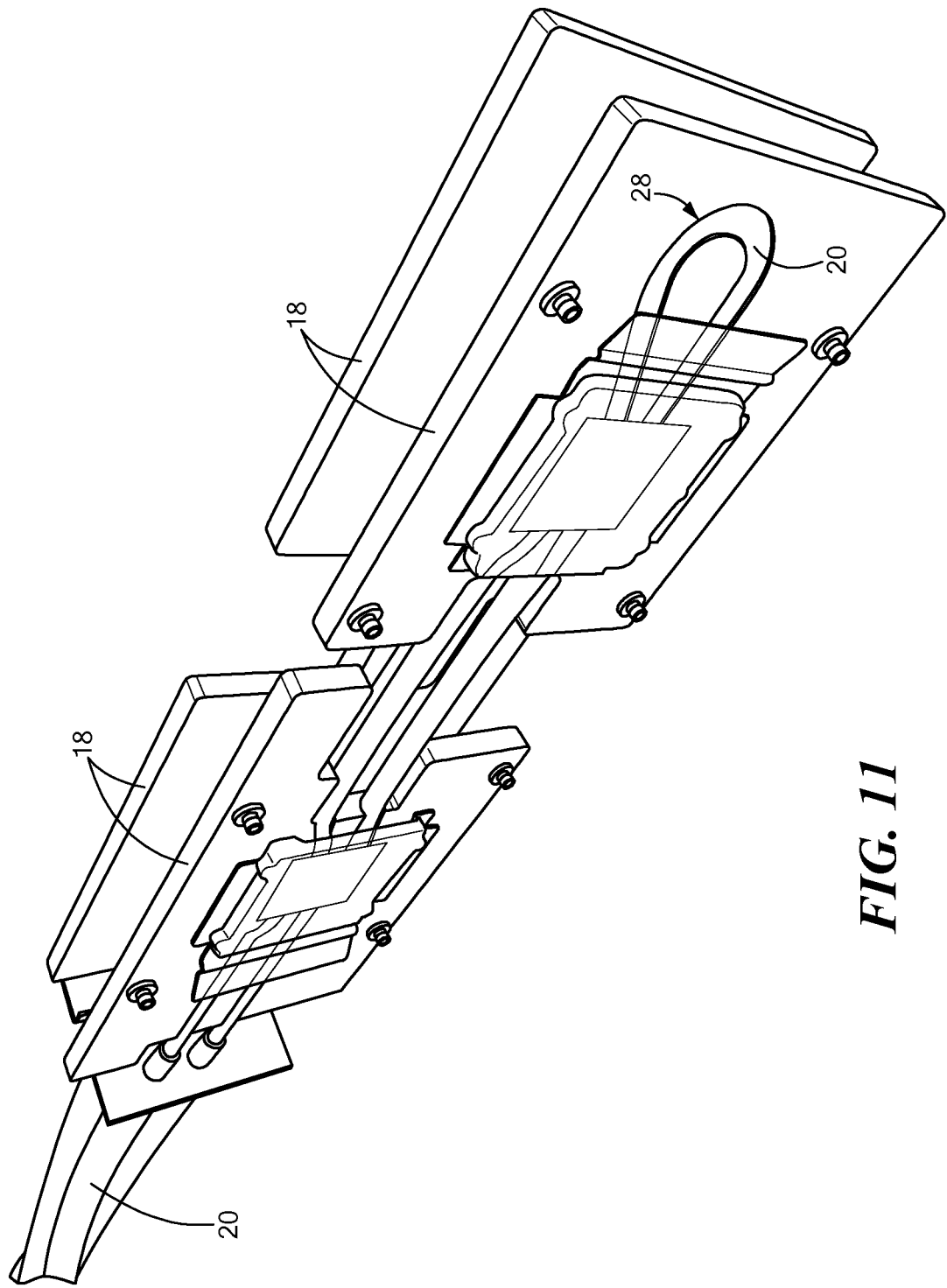
FIG. 11 shows a bottom perspective view of a double cold sink plate configuration in accordance with an embodiment of the present invention.
Figure 12A:
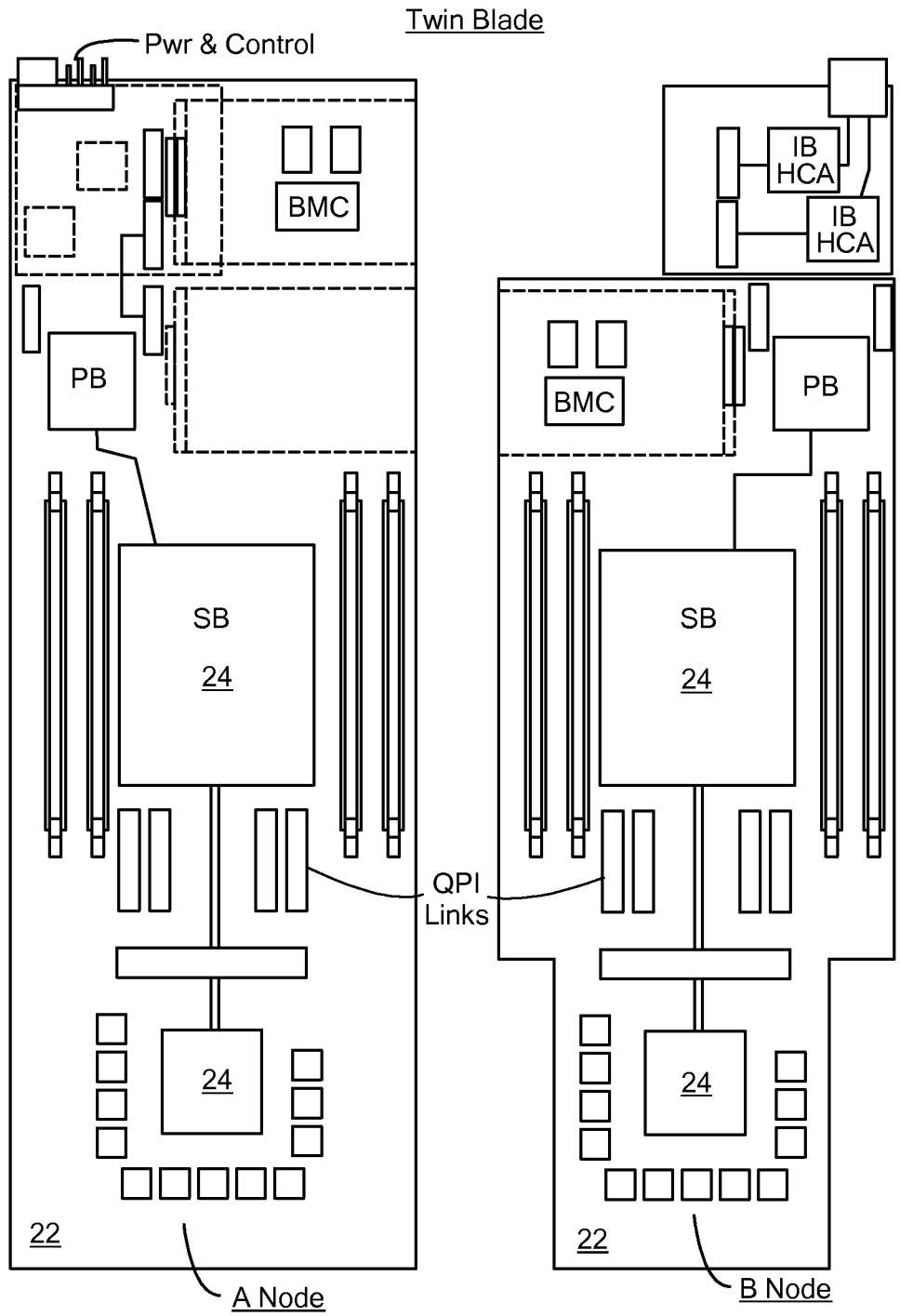
FIGS. 12A and 12B schematically show a plan view of two nodes and a side view of the two nodes assembled, respectively, in a two-node blade with an on-blade cold sink in accordance with an embodiment of the present invention.
Figure 12B:
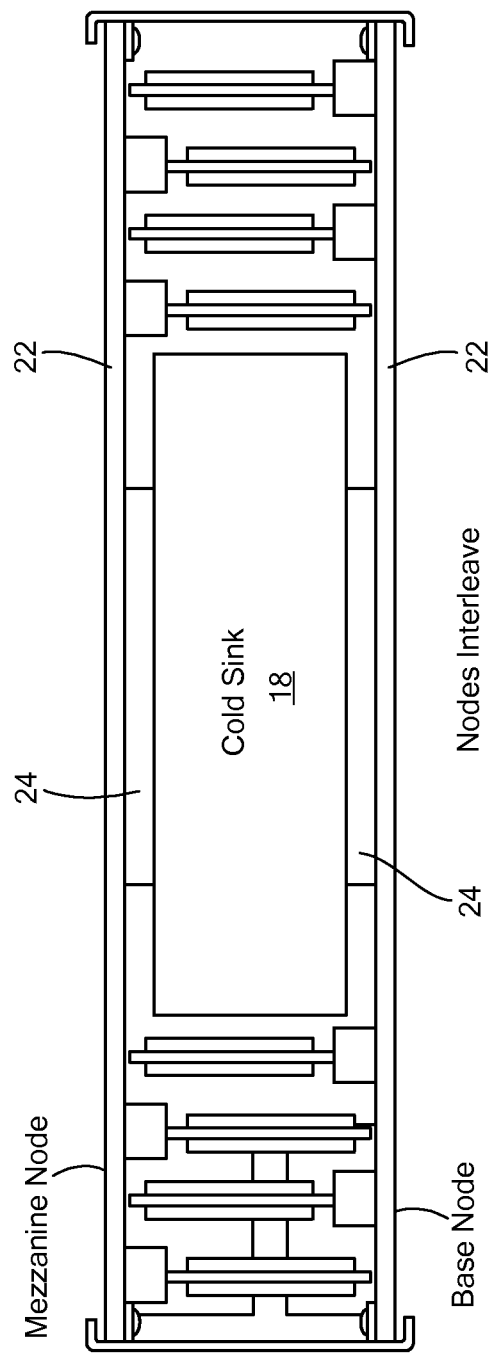
Figure 13A:
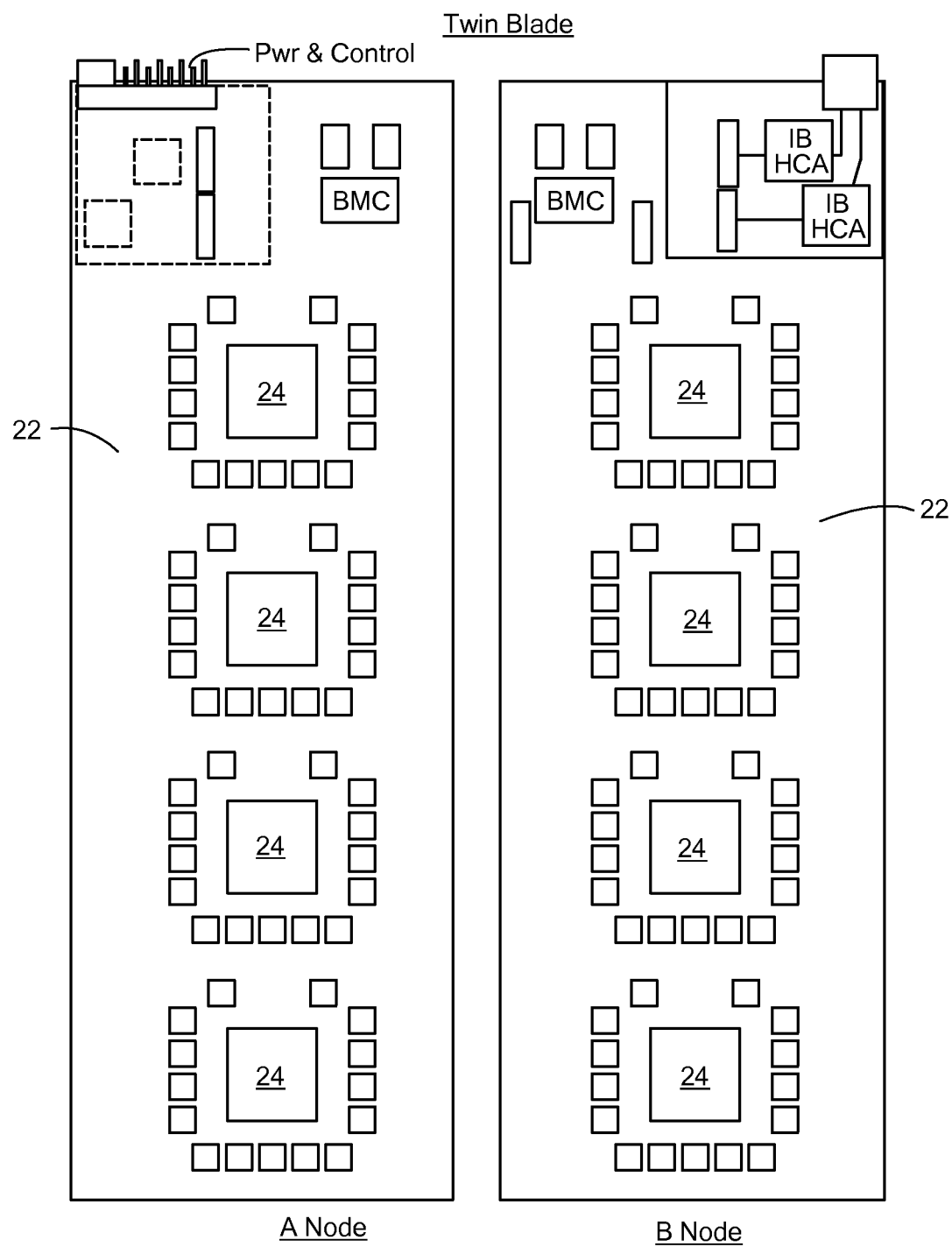
FIGS. 13A and 13B schematically show a plan view of two nodes and a side view of the two nodes assembled, respectively, in a two-node blade with an on-blade cold sink in accordance with an embodiment of the present invention.
Figure 13B:
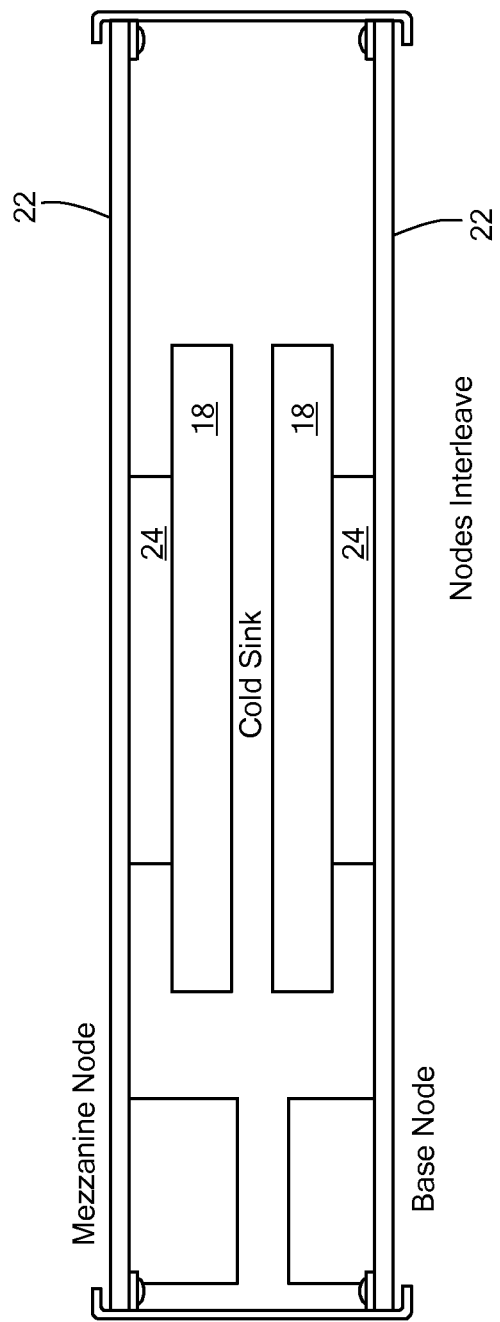

In the on-blade cooling system, a set of single cooling plates 18 may be used, such as shown in FIGS. 8 and 9, so that each cooling plate 18 is sandwiched between two computing boards 22 in two regions of the computing blade 16. However, the cooling plates 18 are not permanently fixed to, and an integral part of, the computing boards 22, and thus are readily removable from the blade 16. Alternatively, two sets of cooling plates 18 may be used, such as shown in FIGS. 10 and 11. In this case, two cooling plates 18 are disposed between the two computing boards in one region of the computing blade 16 and two cooling plates 18 are disposed between the two computing boards in another region of the computing blade 16, so that each processor 24 in the computing board 22 has its own cooling plate 18. For example, FIGS. 12A and 12B show a computing blade 16 configuration in which a single set of cooling plates 18 are disposed between opposing processor cores 24, and FIGS. 13A and 13B show a computing blade 16 configuration in which two sets of cooling plates 18 are disposed between opposing processor cores 24, so that each processor 24 is adjacent to its own cooling plate 18.

Figure 14A:
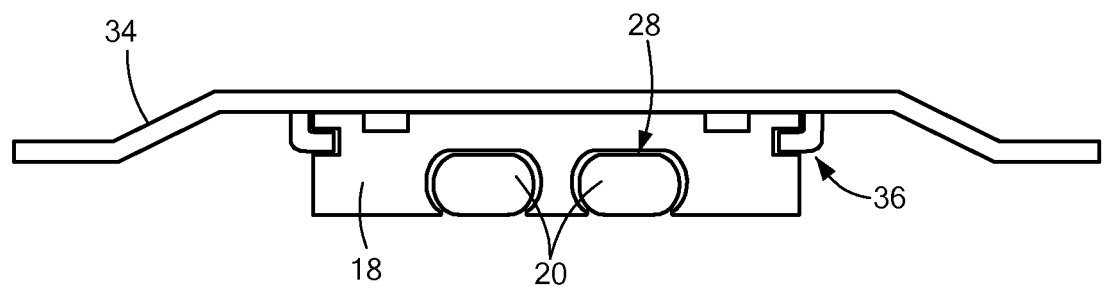
FIGS. 14A and 14B schematically show a side view and a top view, respectively, of a cold sink plate and an attachment mechanism in accordance with an embodiment of the present invention.
Figure 14B:
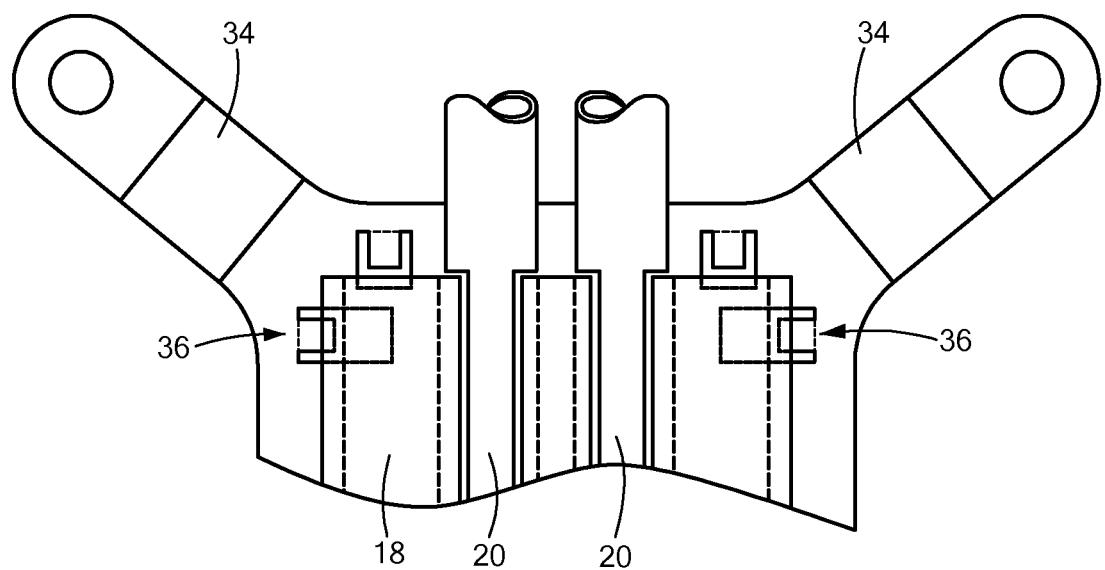

The cooling plates 18 may be attached within the computing blades 16 in any number of ways. For example, as shown in FIGS. 14A and 14B, the cooling plate 18 may be attached to a holding mechanism 34 at the sides of the cooling plate 18, such as with a hook and groove arrangement 36. The holding mechanism 34 may be configured (e.g., in a flat spring clip configuration) such that sufficient force is present to push the one surface of the cooling plate 18 up against the heated component that needs cooling, e.g., the processor core 24. The contact between the inner surface of the cooling plates 18 and the various heated components may be further improved through the use of a compliant thermal interface material. Examples of compliant thermal interface materials are known to those skilled in the art. For example, the processor 24 surface may make contact with the inner surface of the cooling plate 18 via a thermal grease material. Maintaining the contact is important to properly cooling the processor 24 with the cooling plates 18.

A bulkhead or front plate 38 of the computing blade 16 (e.g., as shown in FIG. 10) may be readily removed in order to allow access to the internal portions of the computing blade 16 and allow the installation and removal of the cooling plates 18 without blade disassembly. In addition, the front plate 38 may provide an electromagnetic interference (EMI) barrier between the internal computing blade components and the exterior environment.

Figure 15:
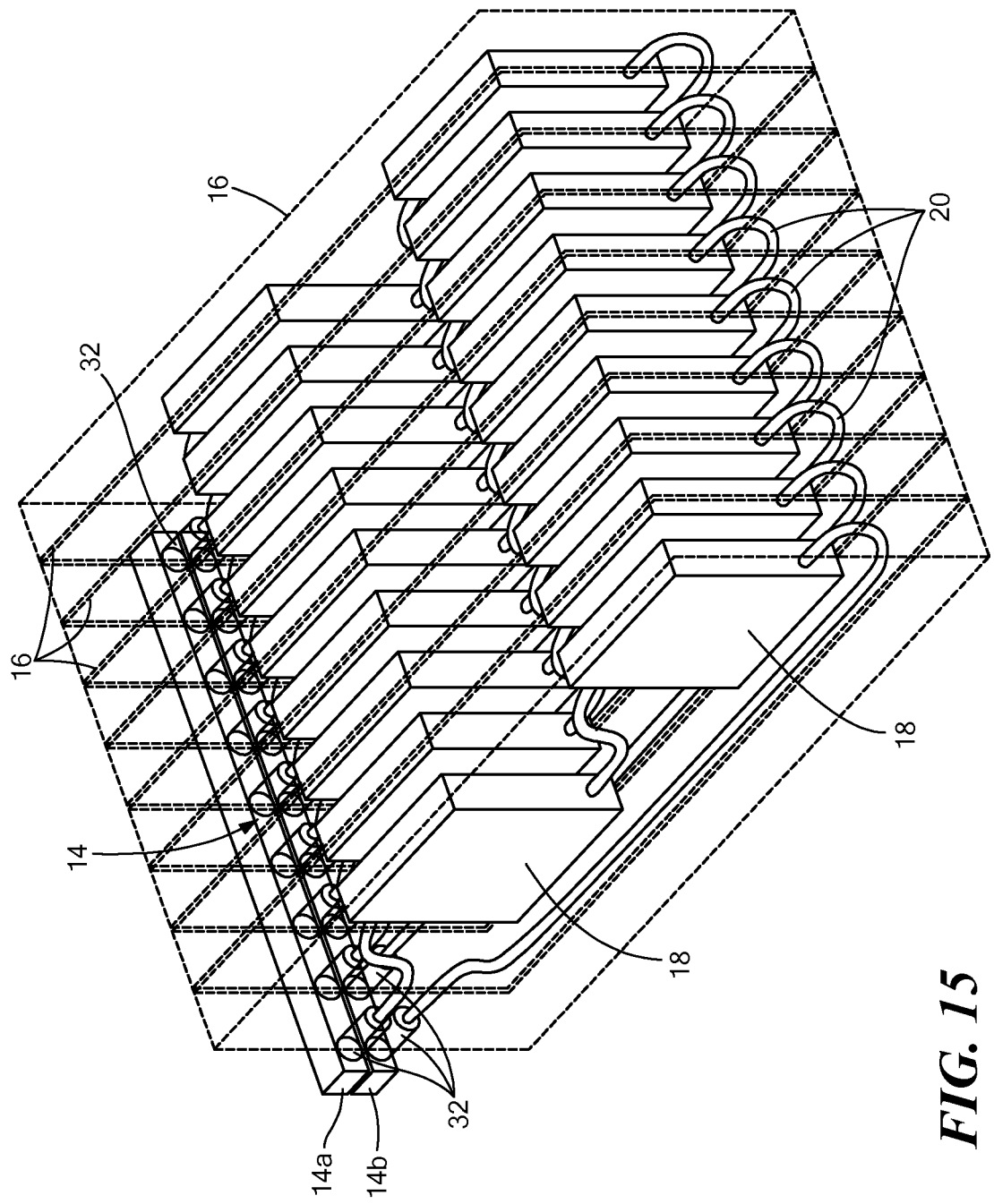
FIG. 15 schematically shows an arrangement of cold sink plates within blades and their attachment to a fluid cooling manifold in accordance with an embodiment of the present invention.

Whether using one or more cooling plates 18, the cooling plate(s) 18 for each computing blade 16 are connected to the fluid cooling manifold 14 via fluid connectors 32 (shown in phantom in FIG. 15). The fluid connectors 32 are attached to the end of the fluid connections 20, e.g., the end of a flexible hose. This configuration allows the cooling fluid from the cooling manifold 14 to flow through each of the fluid connections 20 for each of the computing blades 16 (and thus through each set of cooling plates 18 within the given computing blades 16) substantially in parallel with one another.

Although the cooling manifold 14 is shown in a vertical orientation along the sides of the blade enclosure in FIGS. 4A and 4B, the cooling manifolds may be located in other areas and orientations. For example, FIG. 16 shows a compute rack 40 configuration in which the cooling plates 18 within the compute blades 16 are connected to the cooling manifolds 14 at the rear of the compute rack 40. In this configuration, the cooling manifolds 14 are located in the blade enclosure 12 in a horizontal orientation along the back of the compute rack 40 and then in a vertical orientation along the side of the compute rack 40. However, placing the connections of the cooling manifold 14 to the fluid connections 20 towards the front of the blade enclosure 12 readily allows visual inspection of the fluid connector 32 and fluid connections 20 in case of any leaks.

Cooling Distribution Unit with On-Blade Cooling

Figure 17:
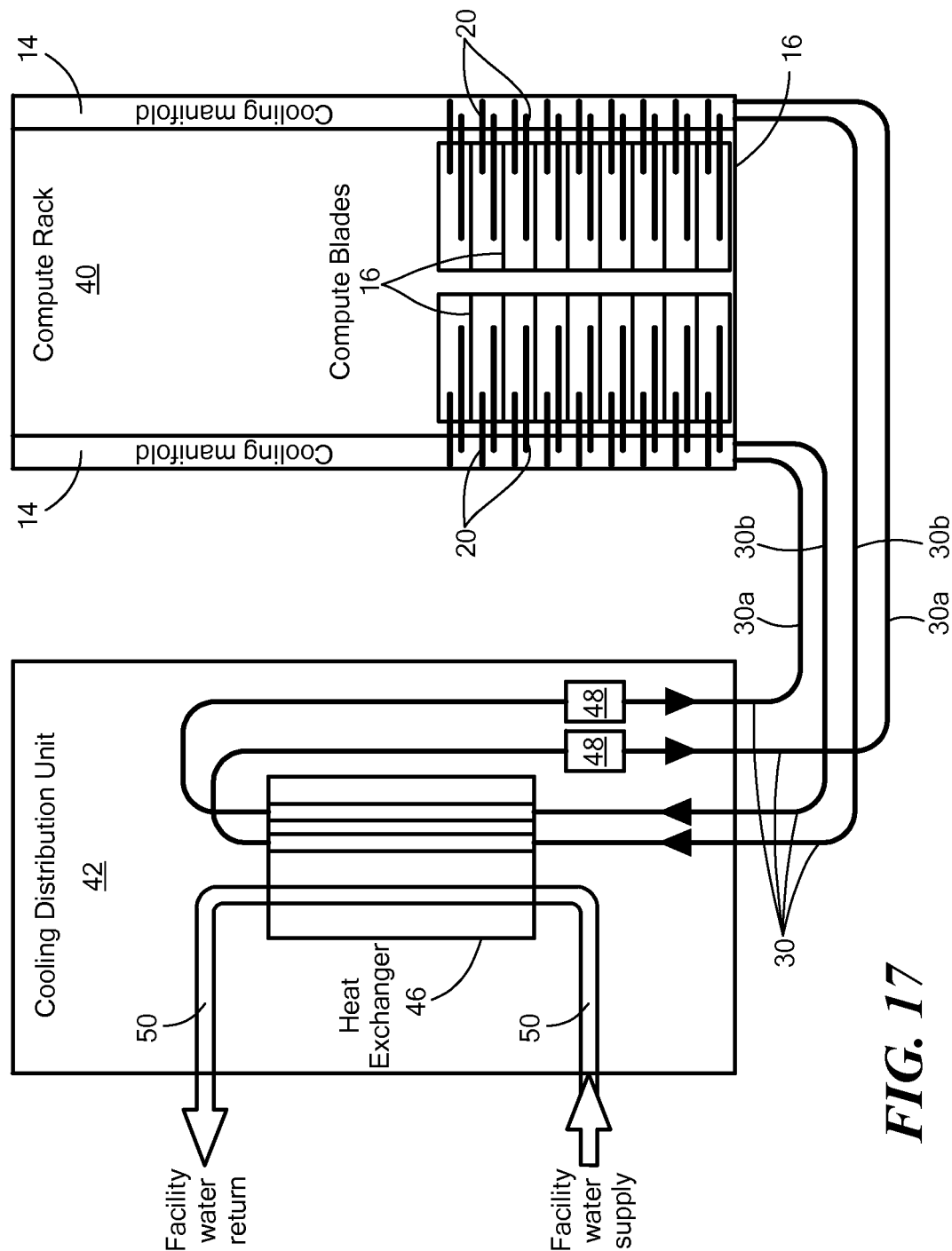
FIG. 17 schematically shows the water flow between one compute rack and an external cooling distribution unit (CDU) in accordance with an embodiment of the present invention.

As shown in FIG. 17, the on-blade cold sink system may be used with an external cooling system, such as a cooling distribution unit (CDU) 42 that is external to the compute rack 40 and the blade enclosure 12 in order to support an increased cooling requirement for certain types of compute blades, e.g., the 720W Gemini Twin compute blade sold by Silicon Graphics International Corp. of Fremont, Calif. For example, when the amount of heat generated by the compute blade exceeds about 600 watts, a CDU may be used in conjunction with the on-blade cooling system described above. The CDU 42 may be connected to the one or more blade enclosures 12, such as shown in FIG. 17, via a set of fluid connections 30, e.g., hoses, one having a supply line 30a and one having a return line 30b.

Figure 18:
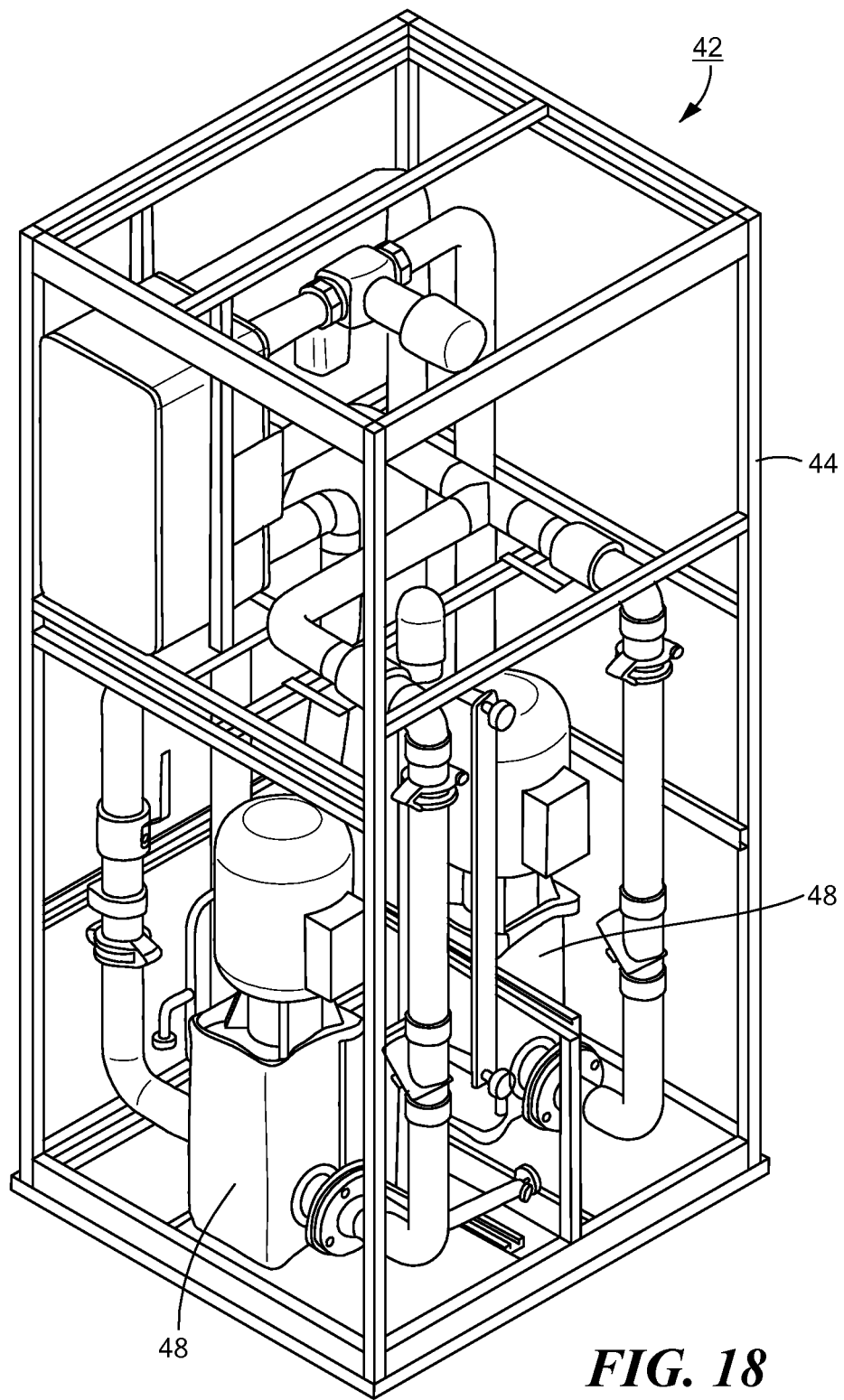
FIG. 18 schematically shows an external cooling distribution unit (CDU), with portions of the housing removed, for use with an on-blade cold sink configuration in accordance with an embodiment of the present invention.

Referring also to FIG. 18, the CDU 42 includes a housing 44 that encloses a heat exchanger 46 and one or more circulating pump(s) 48 along with other controls, valves and piping. FIG. 17 shows the coolant path from the CDU 42 to a set of cooling manifolds 14 located at the sides of the blade enclosures 12. In operation, the one or more circulating pumps 48 are configured to move cooling liquid within the supply line 30*a* of the fluid connections 30 to the cooling manifolds 14 and then through the fluid connections 20 that connect each individual blade 16 to the cooling manifolds 14. After the cooling liquid flows through the passages 28 in the cooling plate 18 and removes the heat generated by the processors 24 in the blade 16, then the cooling liquid flows to a return line in the cooling manifold 14 and the warmed cooling liquid is returned to the CDU 42 via the return line 30*b* of the fluid connections 30. The CDU 42 removes the heat from the cooling liquid via the heat exchanger 46, which is cooled with facility supplied cooling water via fluid connections 50, and then the CDU 42 pumps the cooled cooling liquid back to the cooling manifolds 14.

The coolant path from the CDU 42 to the cooling manifolds 14 is a closed-loop system, which helps minimize the amount of liquid lost if a leak occurs in the fluid connections 20 or 30. For example, the closed-loop system may hold approximately 55 gallons of distilled water with a water treatment solution, e.g., approximately one liter. Suitable water treatment solutions that may be used include sodium hydroxide solutions, such as those commercial available from Chemtreat, Inc. of Richmond, Va.

The CDU 42 is an interface between the building chilled water system and the cooling manifolds 14 within the compute rack 40 and is designed to circulate and control the chilled water to the cooling manifolds 14. To this end, the CDU 42 may monitor room conditions and prevent coil condensation by maintaining the chilled water being pumped to the cooling manifolds 14 at a temperature above the room's dew point. All functions within the CDU 42 may be automated, such as switching pumps (if applicable), controlling water temperature, etc. The CDU 42 is connected by fluid connections 50 to the building supply and return piping, and also connected to the cooling manifolds 14 by fluid connections 30.

Closed-Loop Cooling Cell Configuration with CDU

Figure 19:
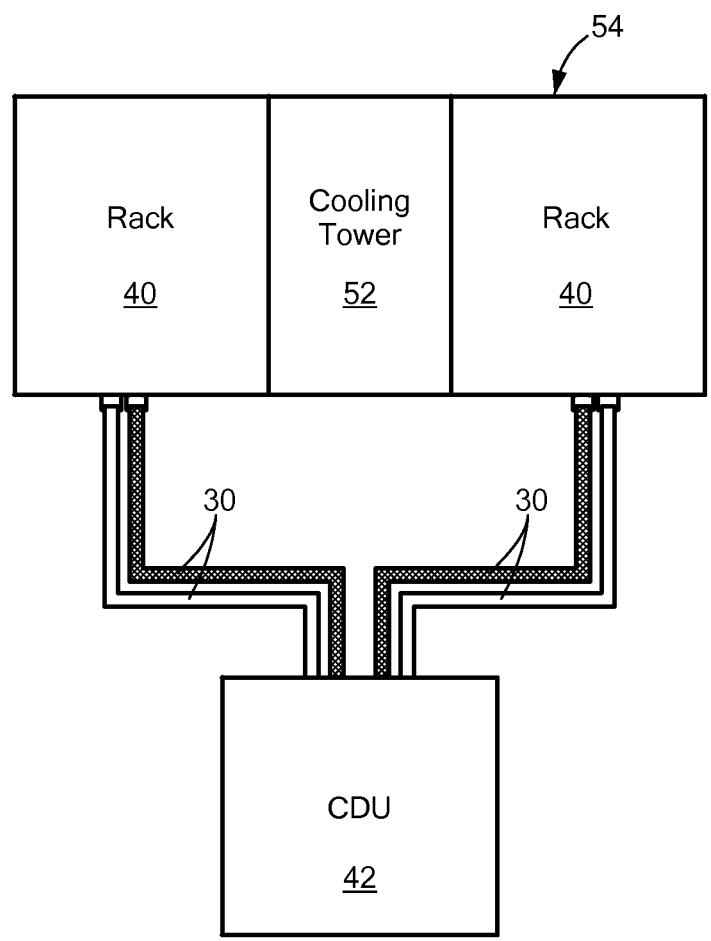
FIG. 19 schematically shows a closed-loop cooling cell configuration with an external cooling distribution unit (CDU) in accordance with an embodiment of the present invention.

The on-blade cold sink system may also be used with a closed-loop cooling cell configuration that includes two compute racks 40 and a cooling tower 52 between the compute racks 40, as shown in FIG. 19. Each compute rack 40 includes at least one blade enclosure 12 having the cooling manifolds 14 and on-blade cooling system as discussed above. The cooling tower 52 may be used with M-Rack and wide-rack configurations that include cooling manifolds 14.

The cooling tower 52 includes one or more water-cooled heat exchangers and one or more blowers configured to draw warm air from the side of the compute racks towards the back, across the water-cooled heat exchanger, and to circulate cooled air to the side of the compute racks towards the front. The closed-loop cooling cell configuration further includes a housing 54 enclosing the compute racks 40 and the cooling tower 52 to provide a closed-loop air flow within the housing 54. Further details of the closed-loop cooling cell configuration can be found in the application Ser. No. 13/931,754 entitled CLOSED-LOOP COOLING SYSTEM FOR HIGH-DENSITY CLUSTERED COMPUTER SYSTEM, which is incorporated by reference herein in its entirety.

Although the above discussion discloses various exemplary embodiments of the invention, it should be apparent that those skilled in the art can make various modifications that will achieve some of the advantages of the invention without departing from the true scope of the invention.

What is claimed is:

1. A high performance computing (HPC) blade comprising:
    a first computing board including at least a first processor core on a first mounting surface thereof;
    a second computing board including at least a second processor core on a second mounting surface thereof, wherein the first mounting surface and second mounting surface face each other in the computing blade;
    a first cooling plate thermally coupled to the first processor core;
    a second cooling plate thermally coupled to the second processor core;
    a fluid connection fluidly coupling the first cooling plate to the second cooling plate such that the first mounting surface and second mounting surface are movable with respect to each other while the first cooling plate remains thermally coupled to the first processor core and the second cooling plate remains thermally coupled to the second processor core.

2. A high performance computing (HPC) blade according to claim 1 wherein the first computing board further comprises a third processor core on the mounting surface thereof and wherein the second computing board further comprises a fourth processor core on the mounting surface thereof; and the blade further comprises:
    a third cooling plate thermally coupled to the third processor core;
    a fourth cooling plate thermally coupled to the fourth processing core; wherein the fluid connection further fluidly couples the third cooling plate to the fourth cooling plate such that the third first mounting surface and fourth mounting surface are movable with respect to each other while the third cooling plate remains thermally coupled to the third processor core and the fourth cooling plate remains thermally coupled to the fourth processor core.

3. A high performance computing (HPC) blade according to claim 1 further comprising a pair of side strucutures, each of the side structures coupled to both the first and the second computing boards defining an enclosure having an interior, the first processor, the second processor, the first cooling plate, the second cooling plate and the fluid connection all being at least partially within the interior of the enclosure.

4. A high performance computing (HPC) blade according to claim 1 wherein the interior of the enclosure includes air flow paths for receiving in air from a fan external to the enclosure.

5. A high performance computing blade according to claim 1 wherein the first computing board includes a plurality of interface ports for receiving one or more modular interface cards wherein the modular interface cards when inserted into the ports reside within the interior of the enclosure and the modular interface cards are air-cooled by an external fan that drives air into the interior of the enclosure.

6. A high performance computing blade according to claim 1 wherein the enclosure includes a removable bulkhead.

* * * * *